(12) United States Patent
Lee et al.

(10) Patent No.: US 12,439,648 B2
(45) Date of Patent: Oct. 7, 2025

(54) TRANSISTOR GATE STRUCTURES AND METHODS OF FORMING THEREOF

(71) Applicant: Taiwan Semiconductor Manufacturing Co., Ltd., Hsinchu (TW)

(72) Inventors: Hsin-Yi Lee, Hsinchu (TW); Weng Chang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 556 days.

(21) Appl. No.: 17/833,348

(22) Filed: Jun. 6, 2022

(65) Prior Publication Data

US 2023/0317859 A1 Oct. 5, 2023

Related U.S. Application Data

(60) Provisional application No. 63/362,053, filed on Mar. 29, 2022.

(51) Int. Cl.
| | |
|---|---|
| *H01L 29/786* | (2006.01) |
| *H01L 29/06* | (2006.01) |
| *H01L 29/423* | (2006.01) |
| *H01L 29/66* | (2006.01) |
| *H01L 29/78* | (2006.01) |
| *H10D 30/01* | (2025.01) |

(Continued)

(52) U.S. Cl.
CPC ....... *H10D 30/6757* (2025.01); *H10D 30/024* (2025.01); *H10D 30/62* (2025.01); *H10D 30/6735* (2025.01); *H10D 62/119* (2025.01)

(58) Field of Classification Search
CPC ......... H01L 29/66545; H01L 29/42392; H01L 29/4966; H01L 29/66795
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

FOREIGN PATENT DOCUMENTS

| | | |
|---|---|---|
| DE | 102020106234 A1 | 8/2021 |
| DE | 102020120658 A1 | 12/2021 |

(Continued)

*Primary Examiner* — John A Bodnar
(74) *Attorney, Agent, or Firm* — Slater Matsil, LLP

(57) ABSTRACT

A device includes a semiconductor substrate; a vertically stacked set of nanostructures over the semiconductor substrate; a first source/drain region; and a second source/drain region, wherein the vertically stacked set of nanostructures extends between the first source/drain region and the second source/drain region along a first cross-section. The device further includes a gate structure encasing the vertically stacked set of nanostructures along a second cross-section. The second cross-section is along a longitudinal axis of the gate structure. The gate structure comprises: a gate dielectric encasing each of the vertically stacked set of nanostructures; a first metal carbide layer over the gate dielectric; and a gate fill material over the first metal carbide layer. The first metal carbide layer comprises Ce, Hf, V, Nb, Sc, Y, or Mo.

20 Claims, 58 Drawing Sheets

(51) Int. Cl.
   *H10D 30/62*   (2025.01)
   *H10D 30/67*   (2025.01)
   *H10D 62/10*   (2025.01)

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 11,302,793 | B2 | 4/2022 | Lee et al. |
| 2007/0148350 | A1* | 6/2007 | Rahtu ............... H01L 21/28562 427/249.17 |
| 2008/0099851 | A1 | 5/2008 | Hsu et al. |
| 2009/0280267 | A1* | 11/2009 | Li .................... H01L 21/28556 427/535 |
| 2015/0179798 | A1 | 6/2015 | Clendenning et al. |
| 2017/0278969 | A1 | 9/2017 | Adusumilli et al. |
| 2018/0122709 | A1 | 5/2018 | Xie et al. |
| 2020/0365706 | A1* | 11/2020 | Lee .................. H01L 29/78696 |
| 2021/0151432 | A1 | 5/2021 | Song et al. |
| 2021/0183707 | A1 | 6/2021 | Ng et al. |
| 2021/0367063 | A1 | 11/2021 | Kao et al. |
| 2022/0037499 | A1 | 2/2022 | Chu et al. |
| 2022/0069135 | A1 | 3/2022 | Chu et al. |
| 2022/0093786 | A1 | 3/2022 | Song et al. |

FOREIGN PATENT DOCUMENTS

| | | |
|---|---|---|
| TW | 202133326 A | 9/2021 |
| TW | 202211327 A | 3/2022 |
| WO | 2005045887 A2 | 5/2005 |
| WO | 2006063269 A2 | 6/2006 |

* cited by examiner

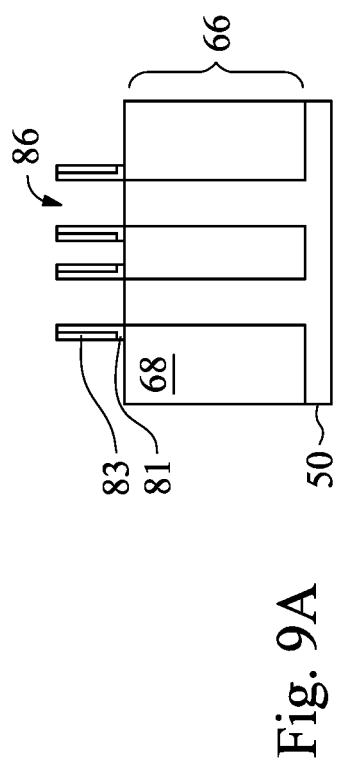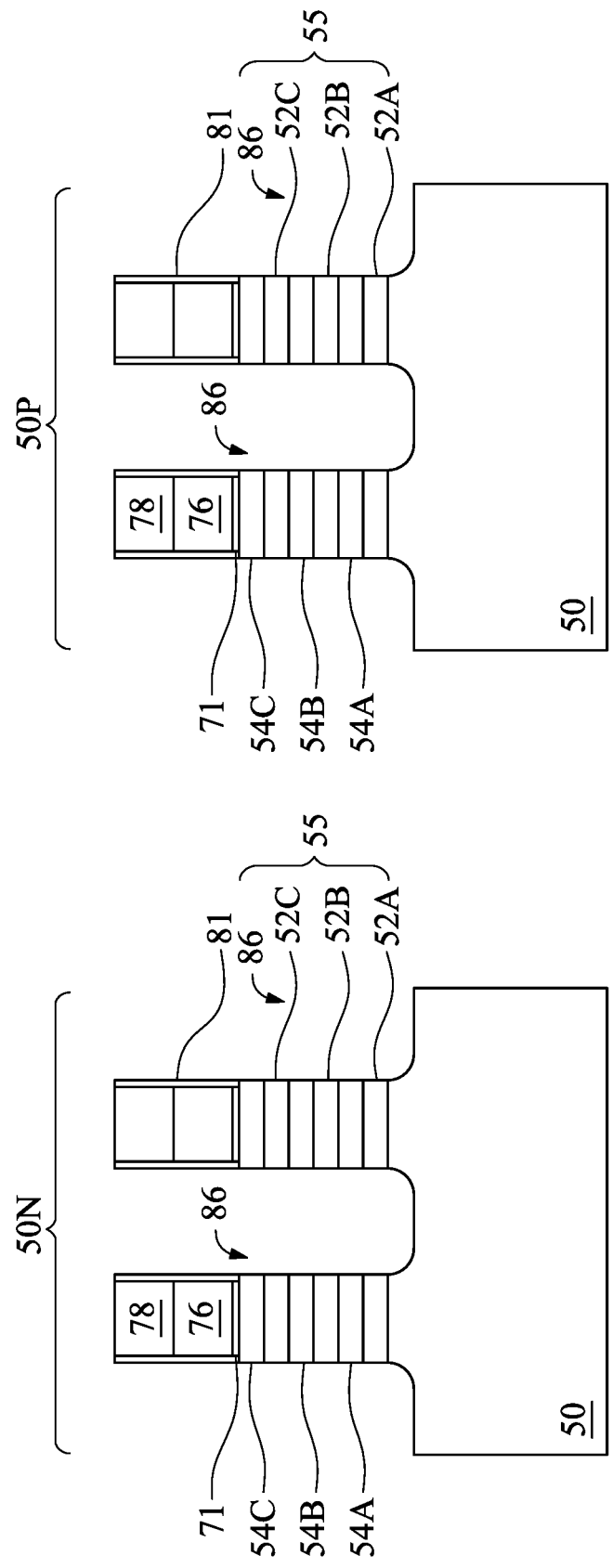
Fig. 9A
Fig. 9B

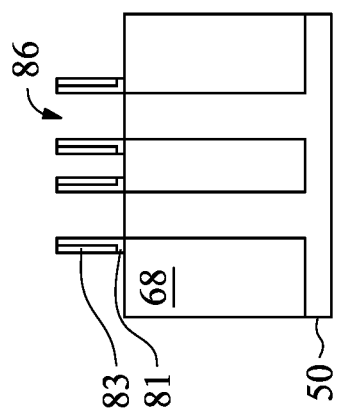
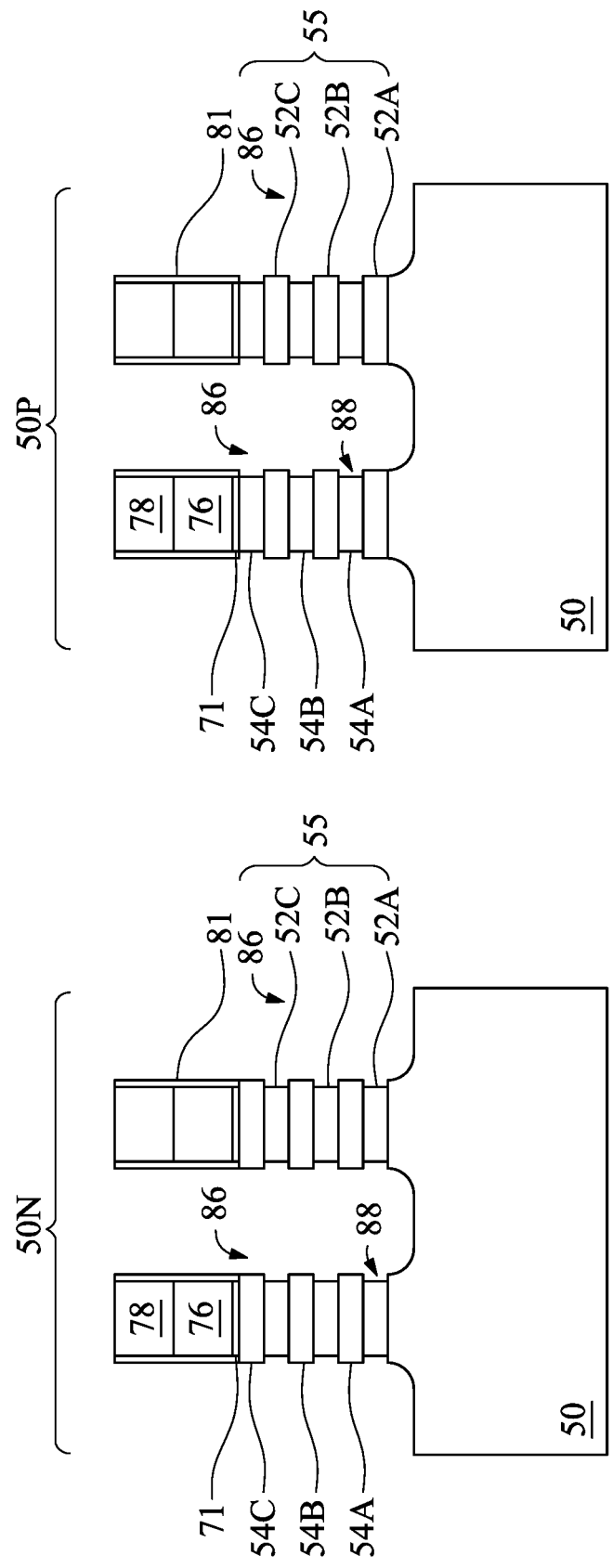
Fig. 10A
Fig. 10B

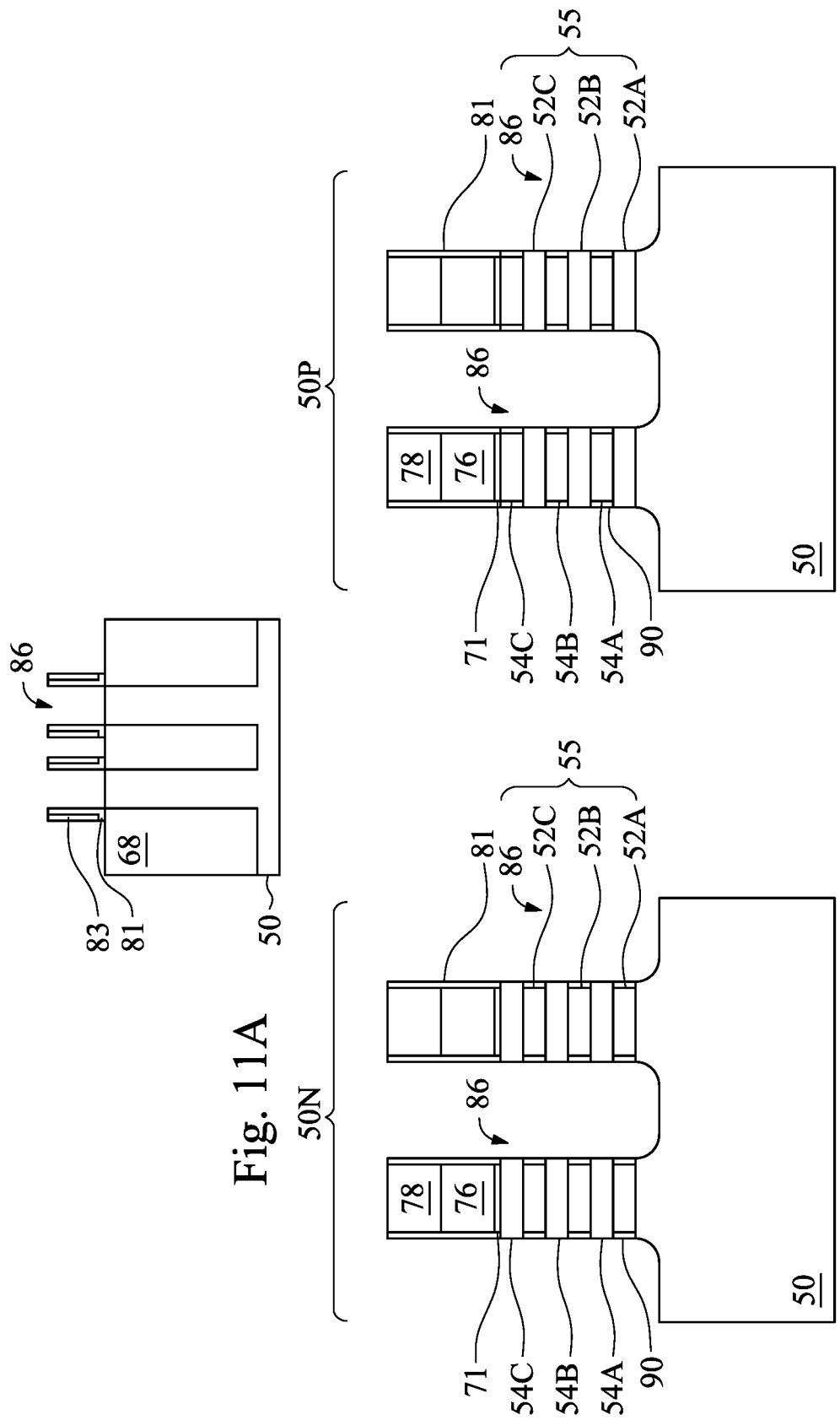

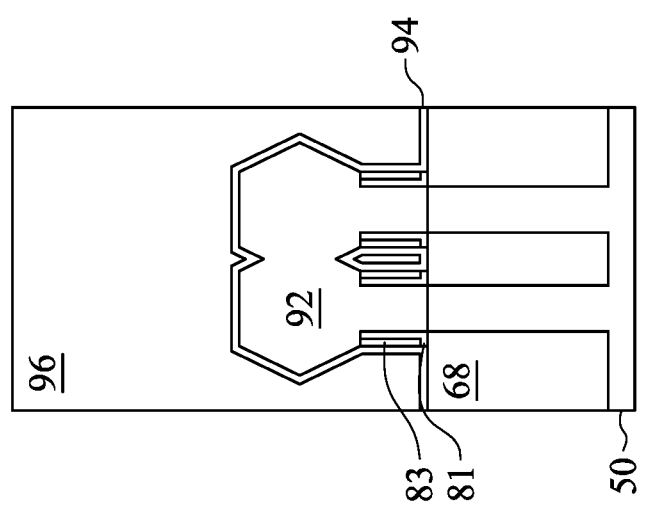

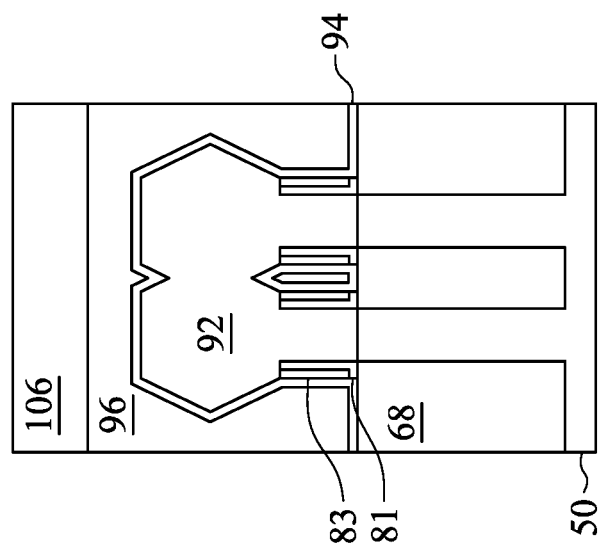

US 12,439,648 B2

TRANSISTOR GATE STRUCTURES AND METHODS OF FORMING THEREOF

PRIORITY AND CROSS-REFERENCE

This application claims the benefit of U.S. Provisional Application No. 63/362,053, filed on Mar. 29, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 17C, 18A, 18B, 19A, 19B, 19C, 19D, 20A, 20B, 20C, 20D, 21A, 21B, 21C, 21D, 22A, 22B, 22C, 23A, 23B, 23C, 24A, 24B, and 24C are cross-sectional views of intermediate stages in the manufacturing of nano-FETs, in accordance with some embodiments.

DETAILED DESCRIPTION

Figure 1:
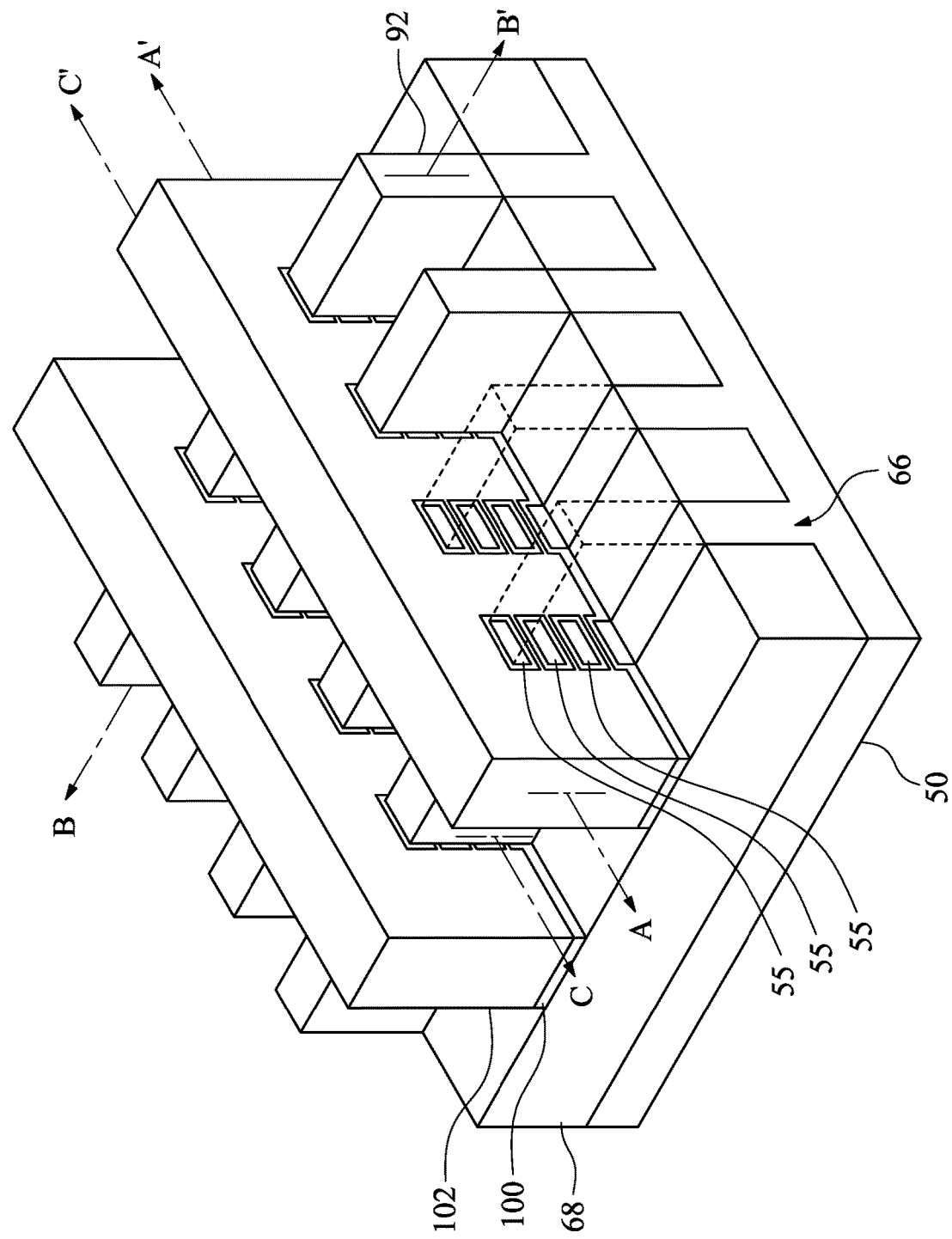
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments herein include a gate structure having a work function metal layer that comprises a metal carbide. For example, the metal carbide may comprise $Ce_{1-y}C_y$, $Hf_{1-y}C_y$, $V_{1-y}C_y$, $Nb_{1-y}C_y$, $Sc_{1-y}C_y$, $Y_{1-y}C_y$, $Hf_{1-y}C_y$, or $Mo_{1-y}C_y$ where y is a number that satisfies $0<y<1$. The metal carbide layer may be used exclusively as the work function metal in the gate structure in some embodiments. In some embodiments, the metal carbide layer may be used in combination with one or more other work function metals (e.g., one or more metal nitride and/or metal carbide layers) to provide multiple work function metal layers in the gate structure. As a result of using different metal carbides as the work function metal, work function tuning may be more precisely achieved.

Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs (Nano-FETs), or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 24C are cross-sectional views of intermediate stages in the manufacturing of nano-FETs, in accordance with some embodiments. FIGS. 2 through 5, 6A, 13A, 14A, 15A, 16A, 17A, 18A, 19A, 19C, 19D, 20A, 21A, 21C, 21D, 22A, 23A, and 24A illustrate reference cross-section A-A' illustrated in FIG. 1. FIGS. 6B, 7B, 8B, 9B, 10B, 11B, 11C, 12B, 12D, 13B, 14B, 15B, 16B, 17B, 17C, 18B, 19B, 20B, 21B, 22B, 23B, and 24B illustrate reference cross-section B-B' illustrated in FIG. 1. FIGS. 7A, 8A, 9A, 10A, 11A, 12A, 12C, 13C, 22C, 23C, and 24C illustrate reference cross-section C-C' illustrated in FIG. 1.

Figure 2:
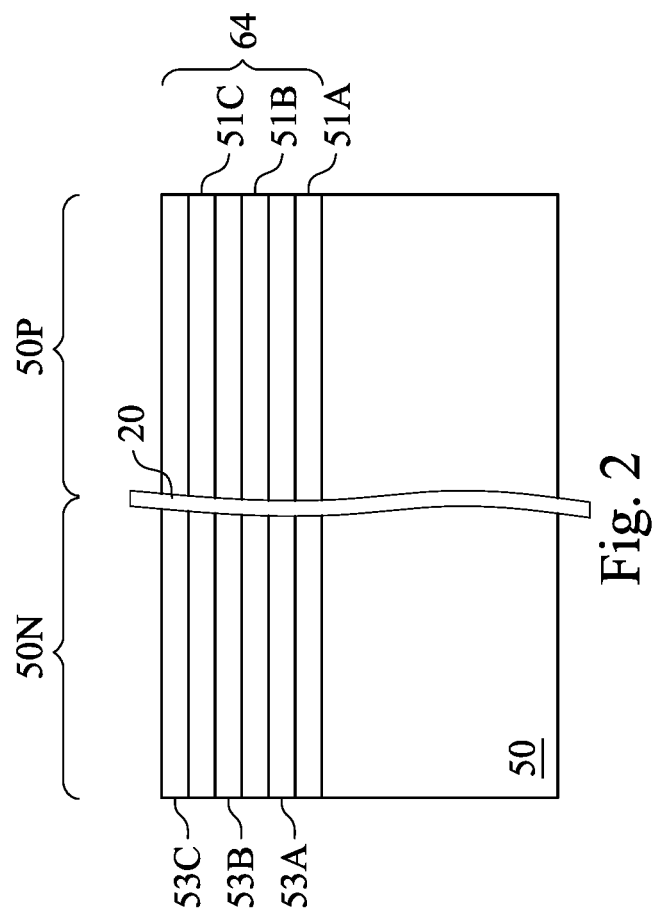

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type region 50N. Nevertheless, in some embodiments the first semiconductor layers 51 may be removed and the second semiconductor layers 53 may be patterned to form channel regions of nano-FETs in the p-type region 50P, and the second semiconductor layers 53 may be removed and the first semiconductor layers 51 may be patterned to form channel regions of nano-FETs in the n-type region 50N.

Figure 25A:
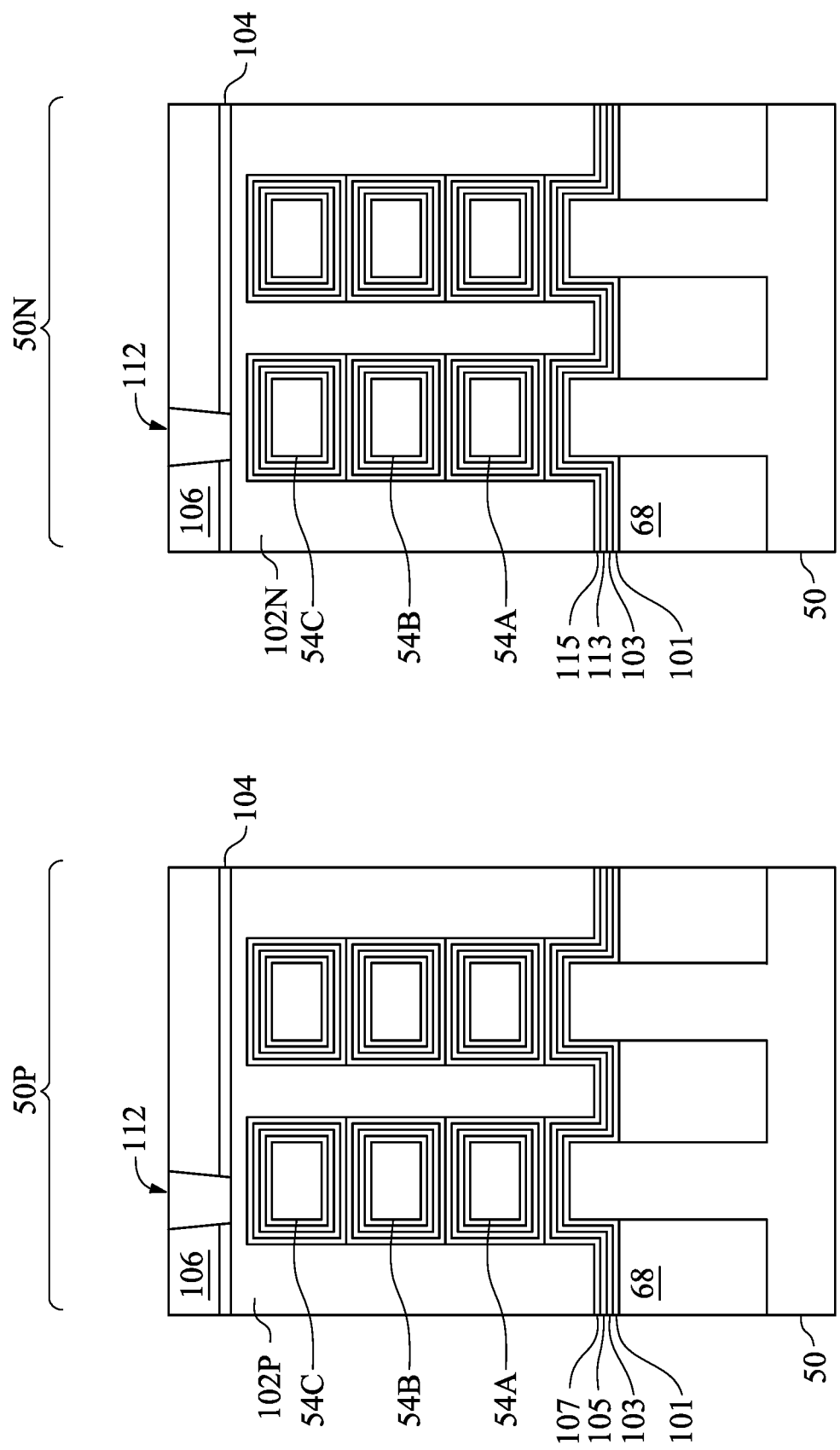
FIGS. 25A, 25B, and 25C are cross-sectional views of a nano-FET, in accordance with some embodiments.
Figure 25B:
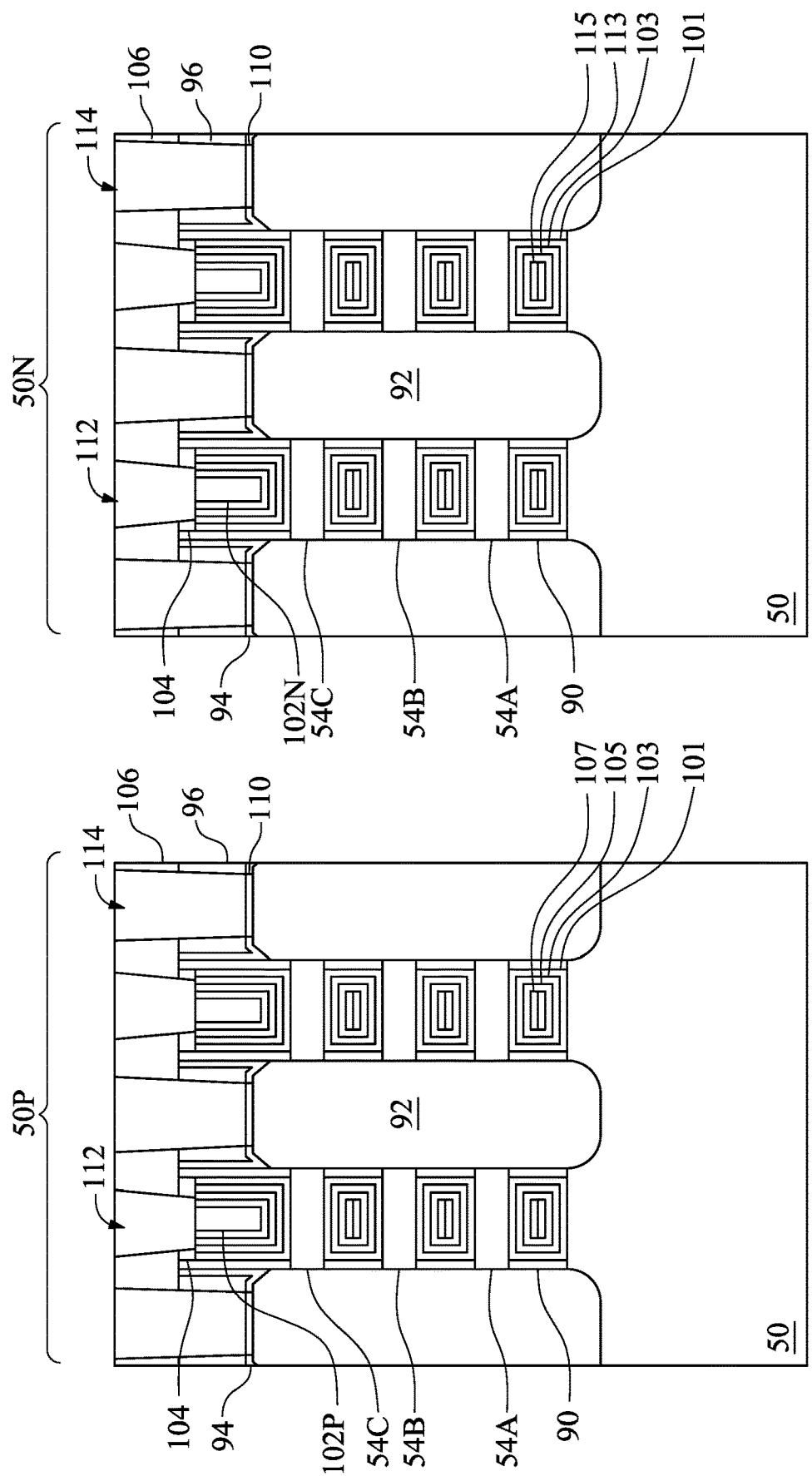
Figure 25C:
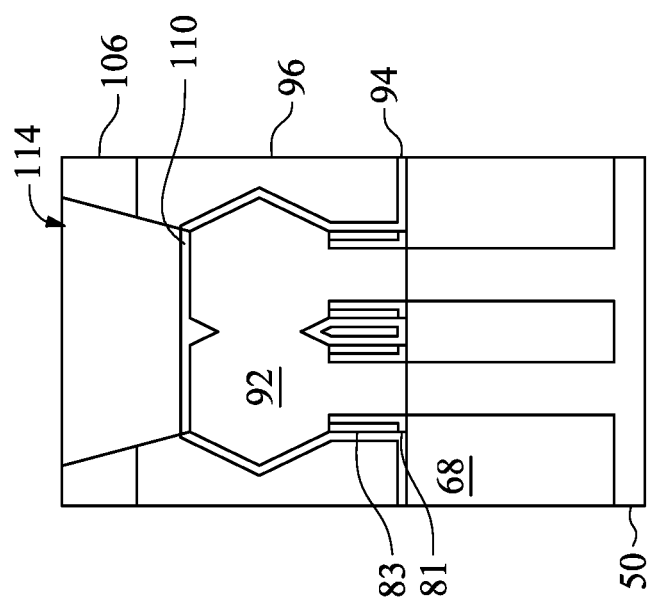

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of non-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 25A, 25B, and 25C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 3:
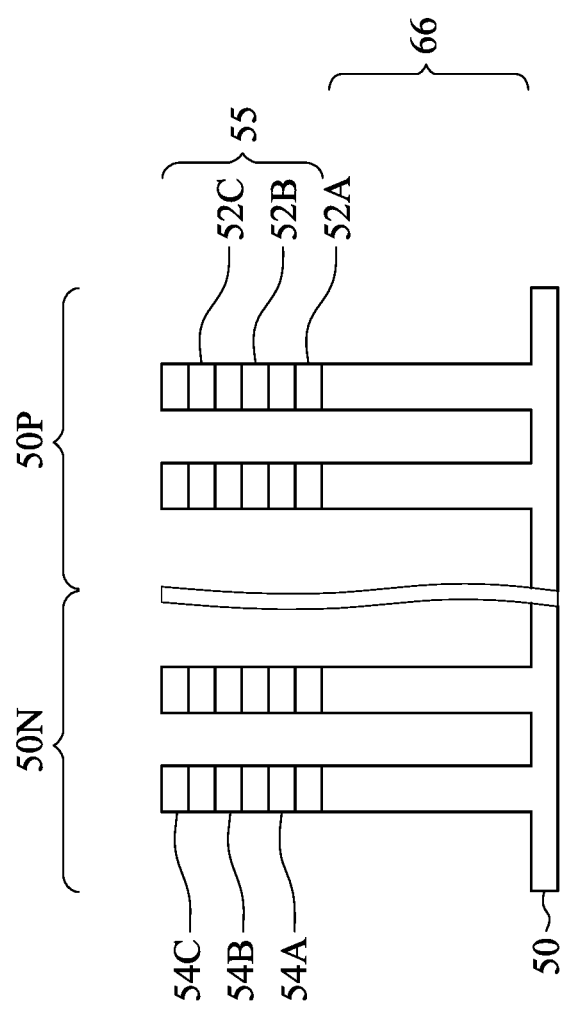

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
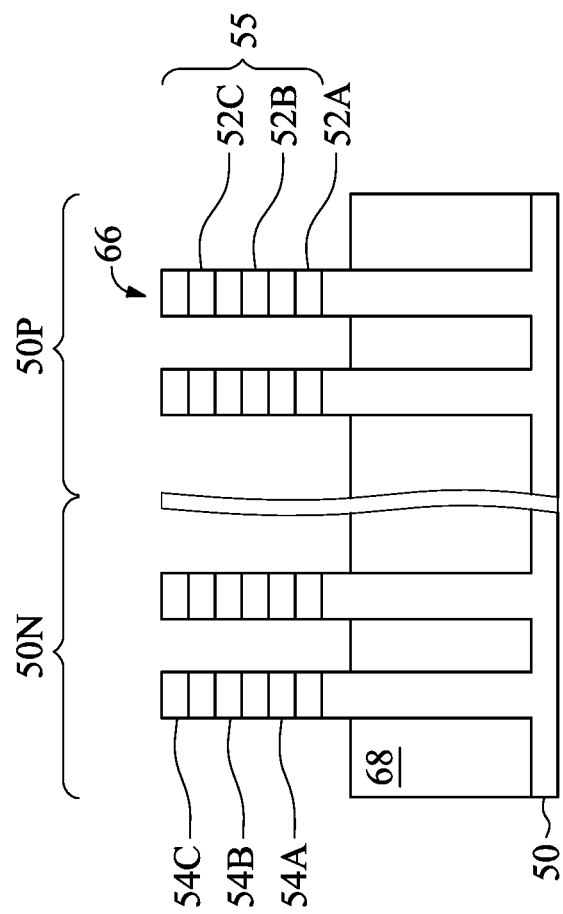

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting nanostructures 52) and the second semiconductor layers 53 (and resulting nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
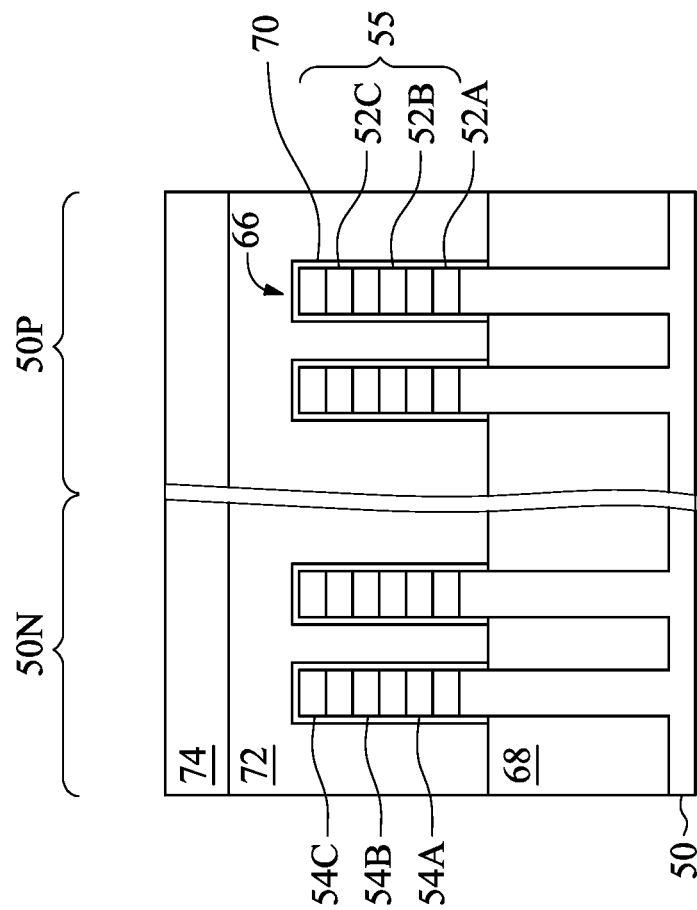

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
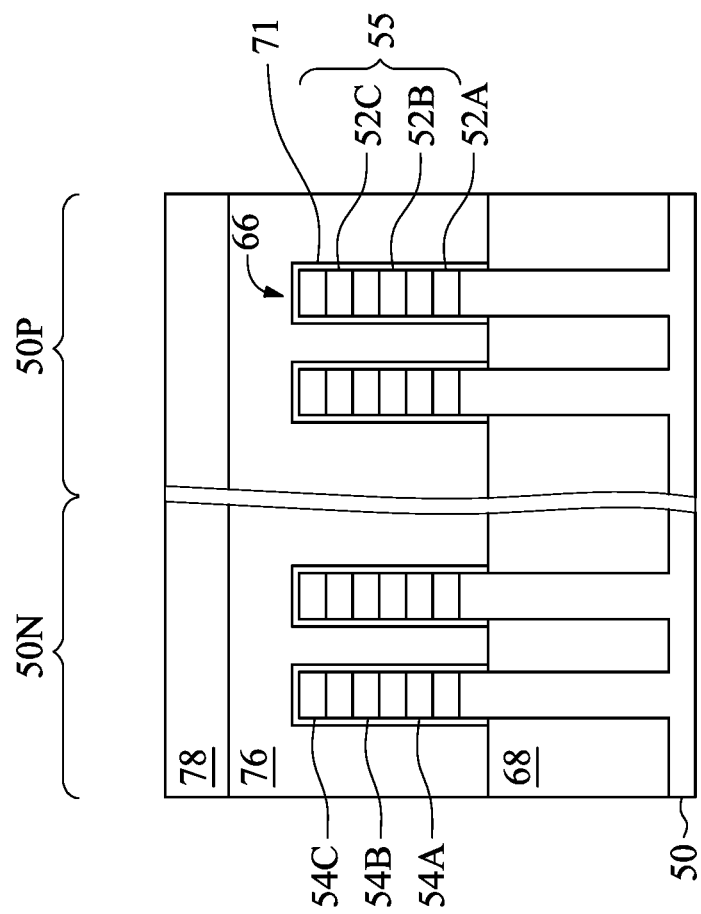
Figure 6B:
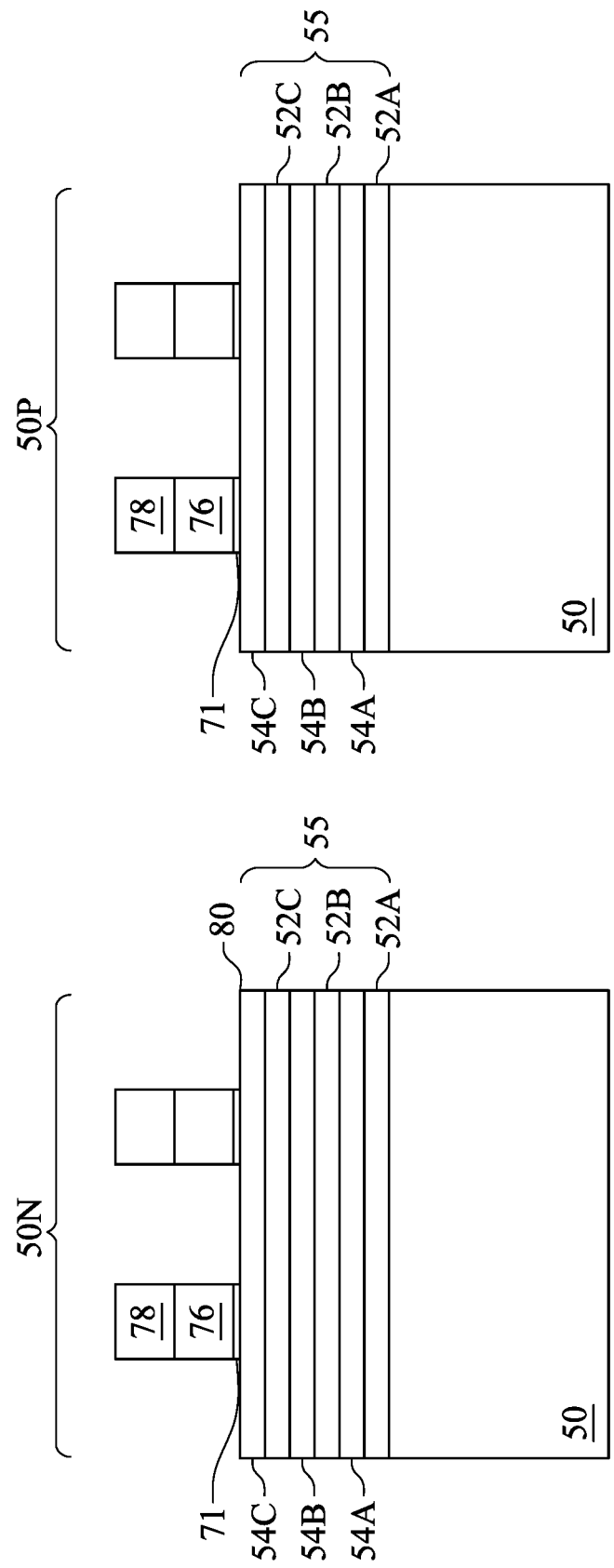

FIGS. 6A through 24C illustrate various additional steps in the manufacturing of embodiment devices. FIGS. 6A, 7A, 8A, 9A, 10A, 11A, 12A, 12C, 13A, 13C, 14A, 15A, 22C, 23C, and 24C illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
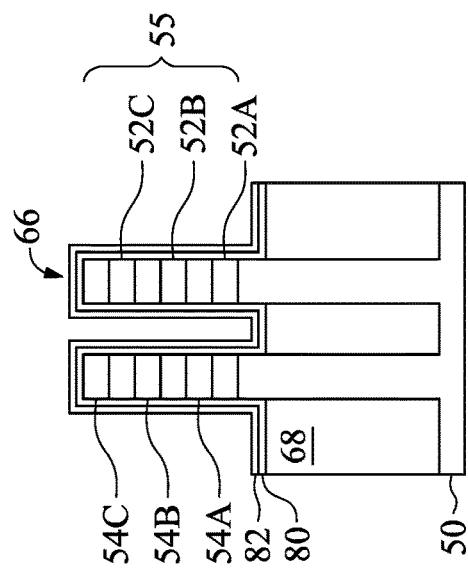
Figure 7B:
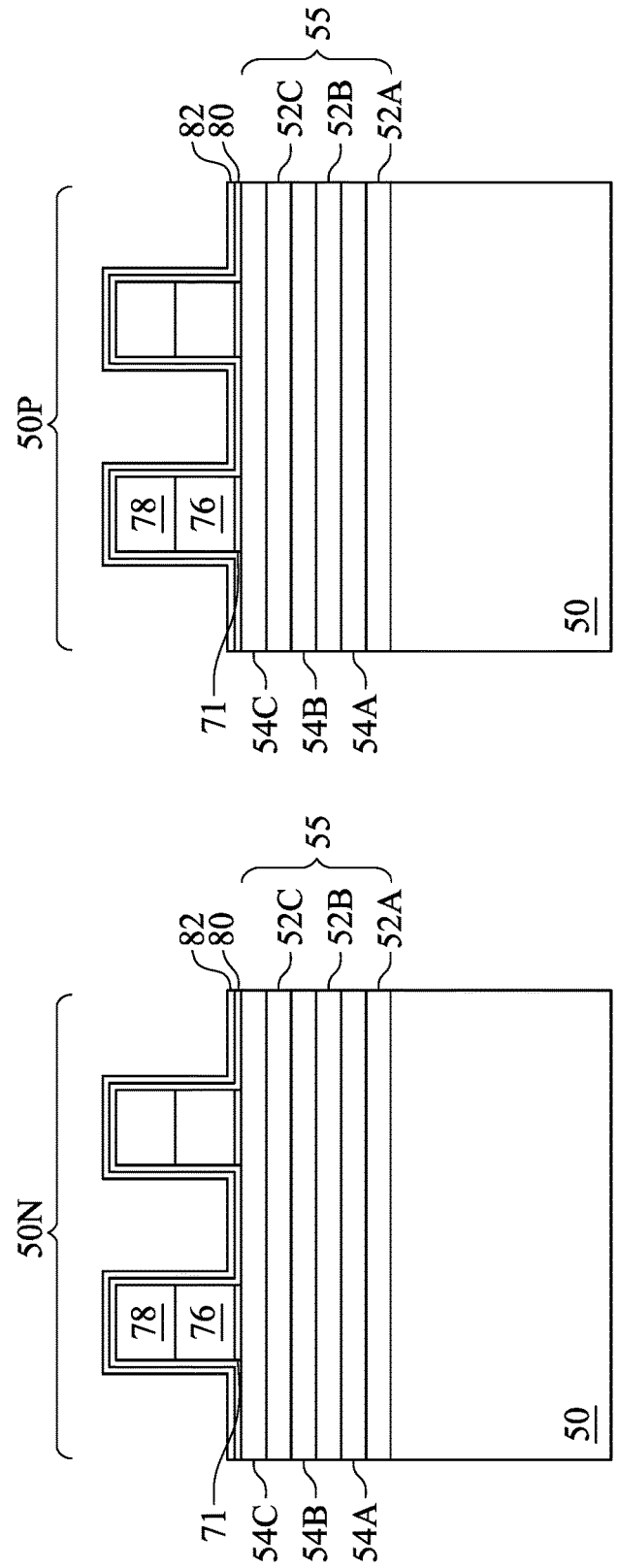

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8A:
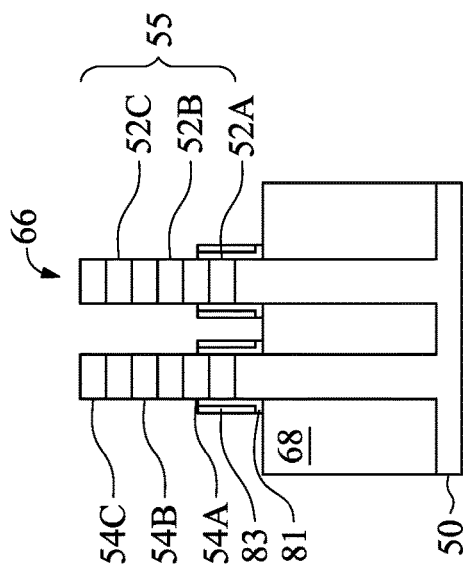
Figure 8B:
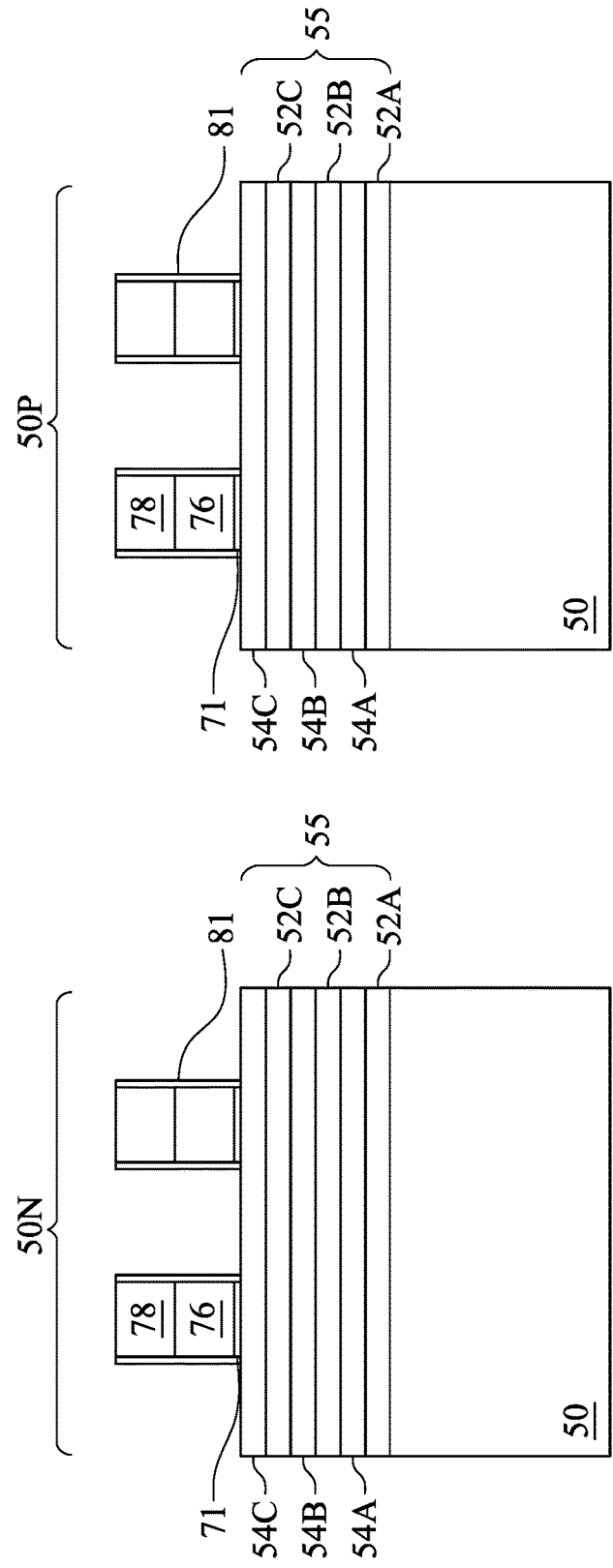

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 64 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

Figure 11C:
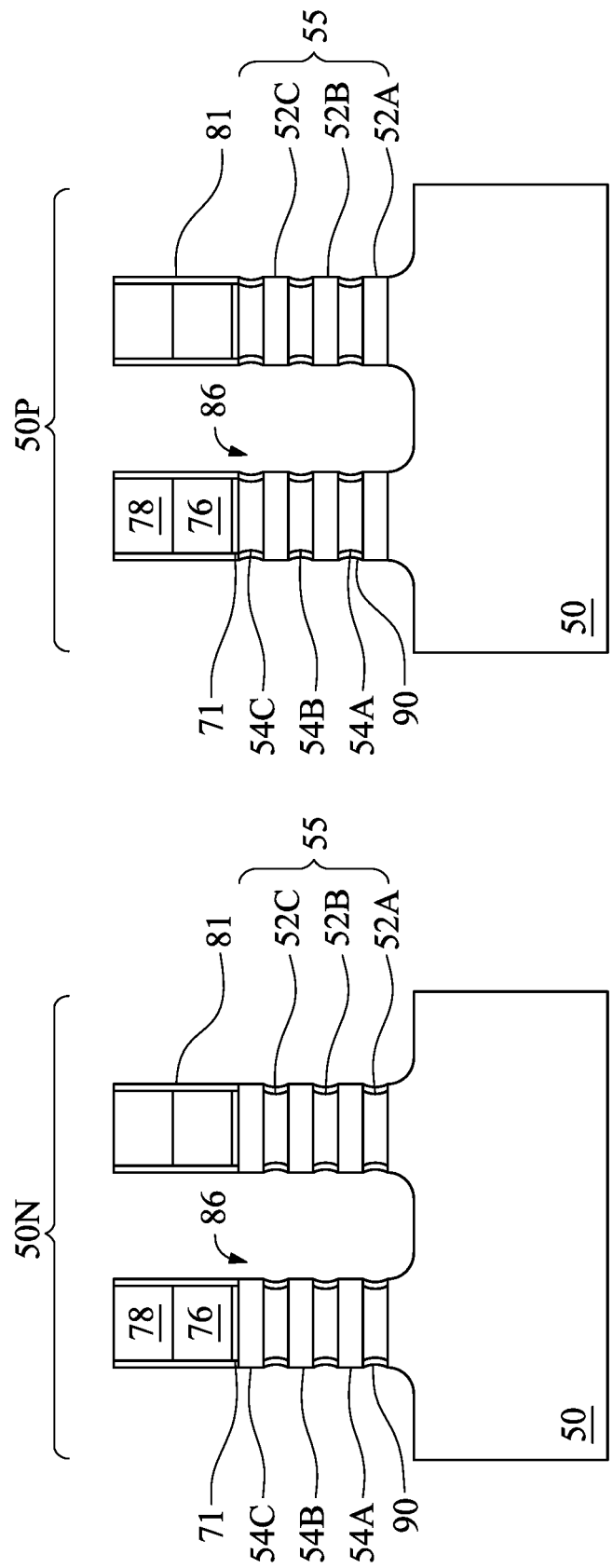

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers 90 are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers 90 are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes, such as etching processes used to form gate structures.

Figures 12A, 12B:
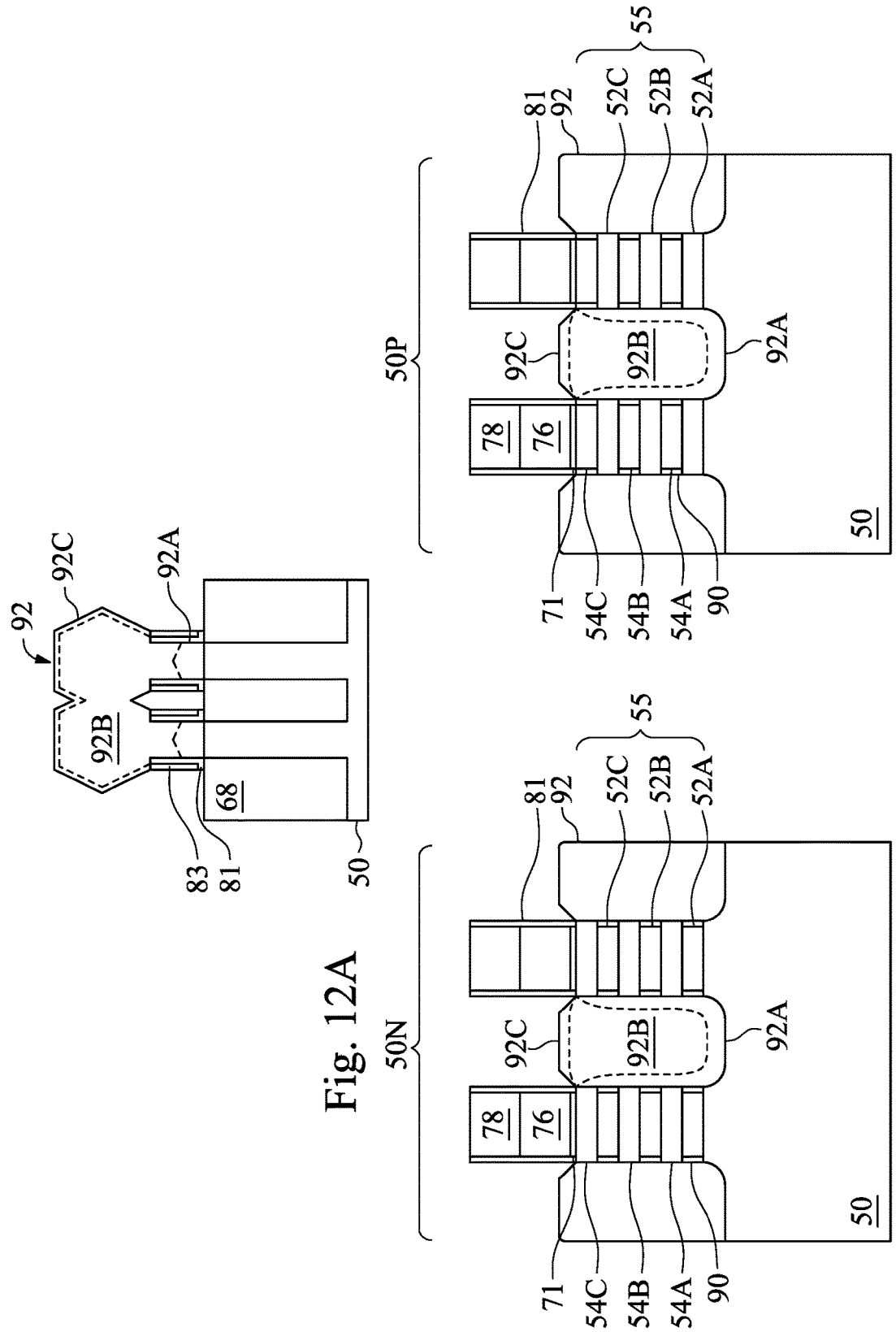
Figure 12C:
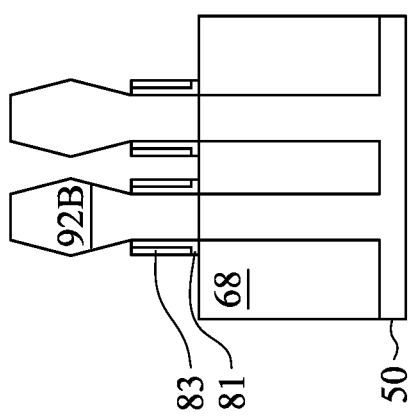

In FIGS. 12A-12C, epitaxial source/drain regions 92 are formed in the first recesses 86. In some embodiments, the source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI regions 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Each of the semiconductor material layers 92A, 92B, and/or 92C may have curved surfaces as a result of the epitaxy process(es) used. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
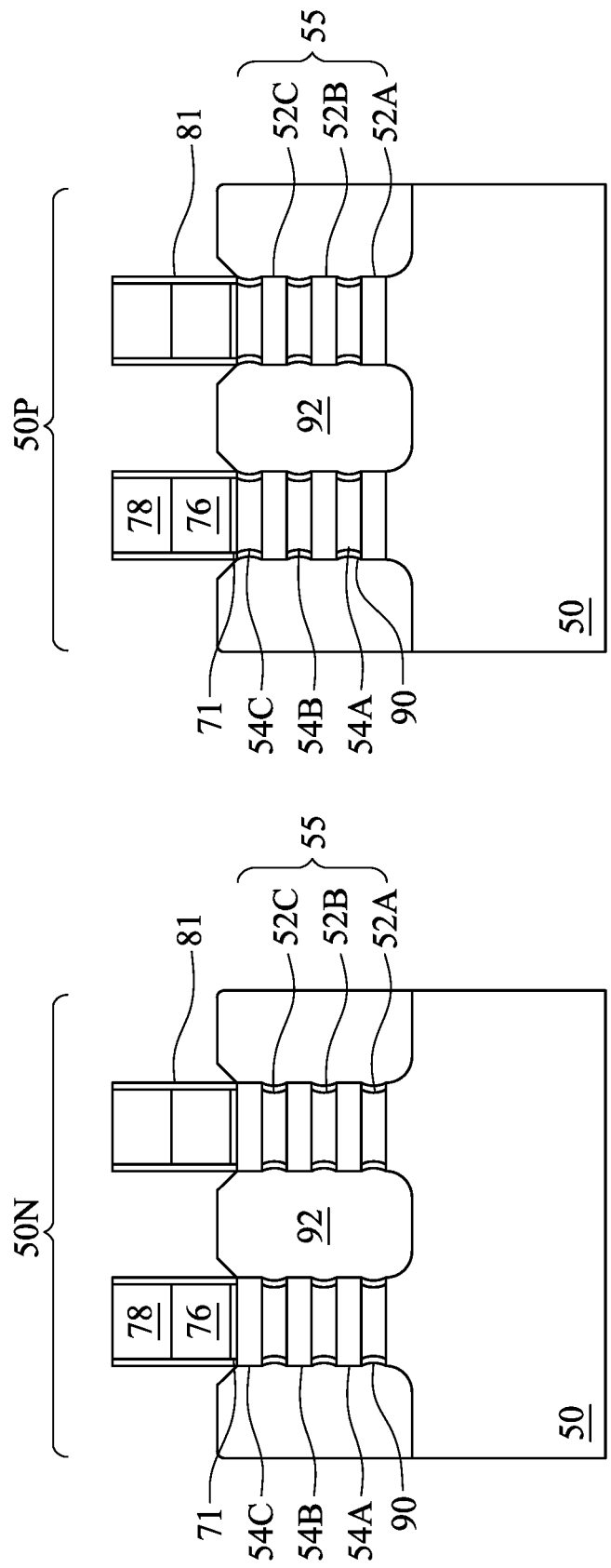

FIG. 12D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 13A:
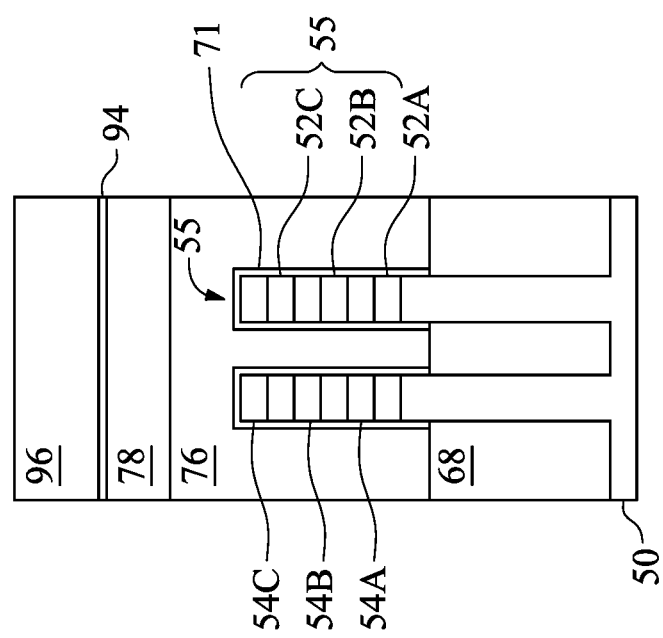
Figure 13B:
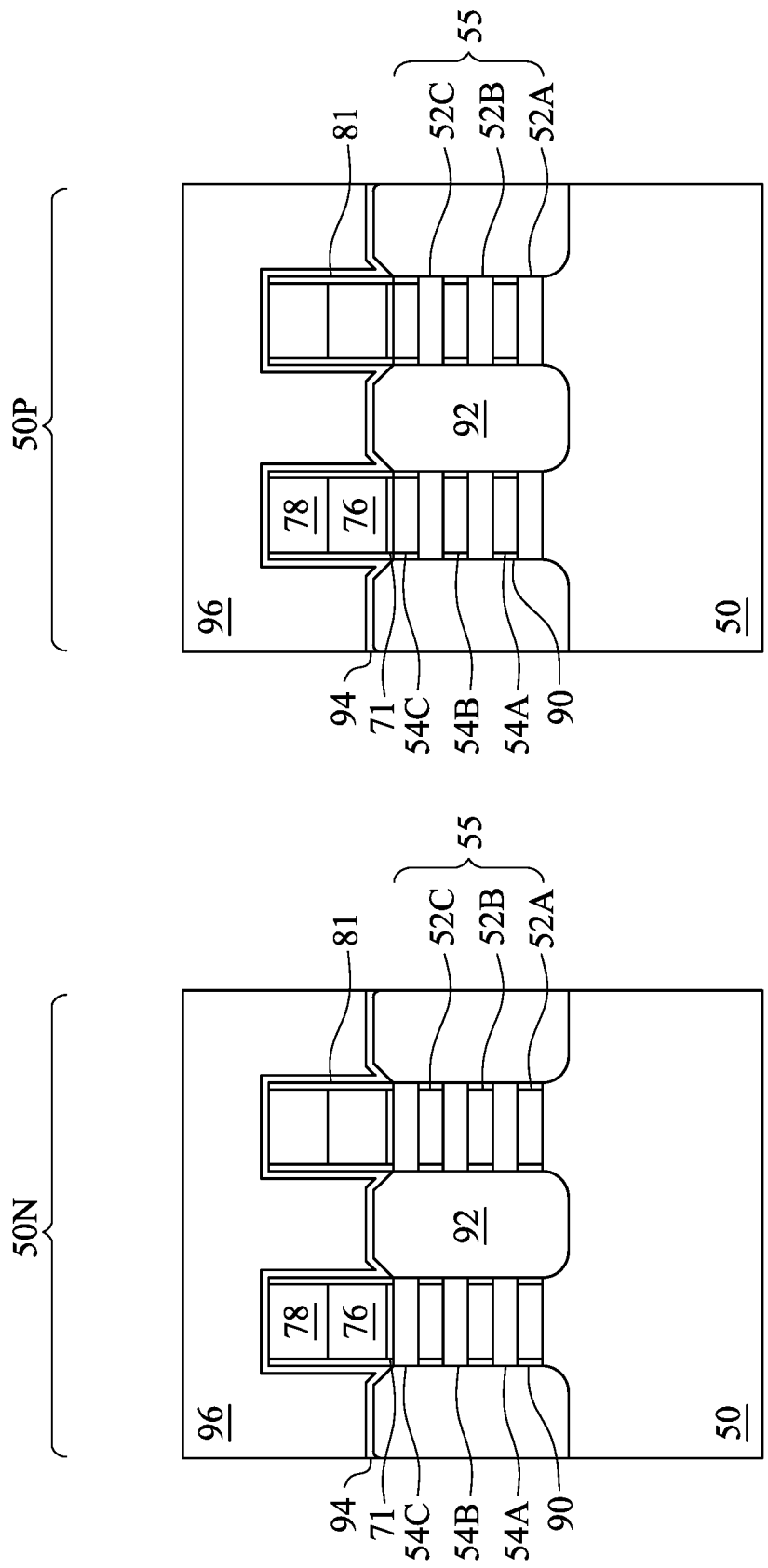

In FIGS. 13A-13C, a first interlayer dielectric (ILD) 96 is deposited over the structure illustrated in FIGS. 6A, 12B, and 12A (the processes of FIGS. 7A-12D do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14A:
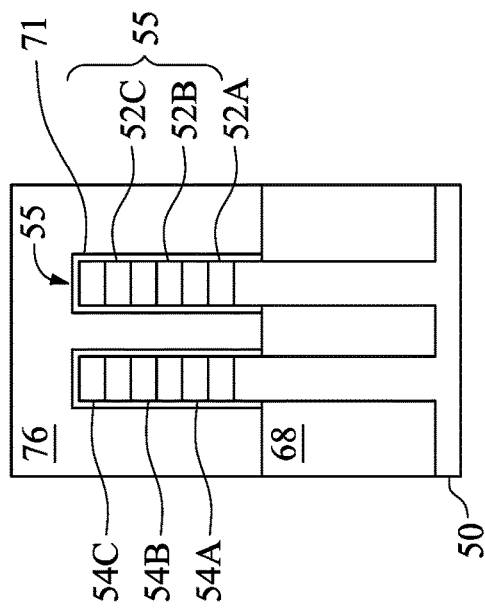
Figure 14B:
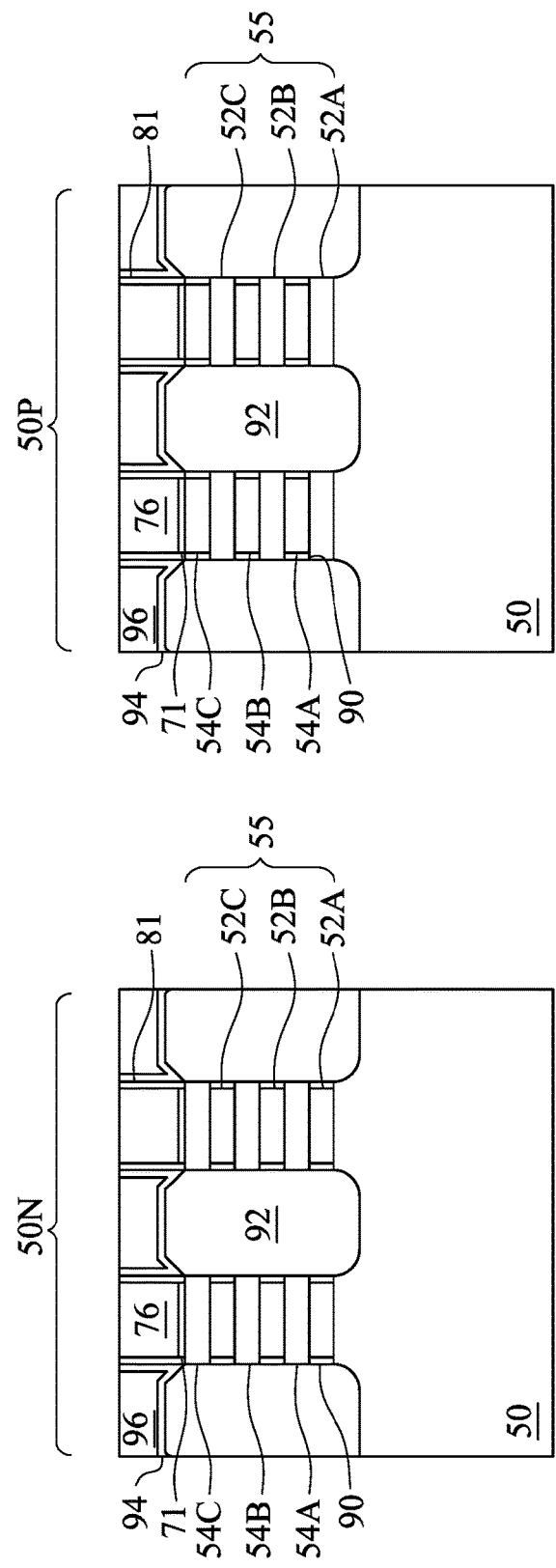

In FIGS. 14A, and 14B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 72 are exposed through the first ILD 96. In some embodiments, the masks 78 may remain, in which case the planarization process levels the top surface of the first ILD 96 with top surface of the masks 78 and the first spacers 81.

Figure 15A:
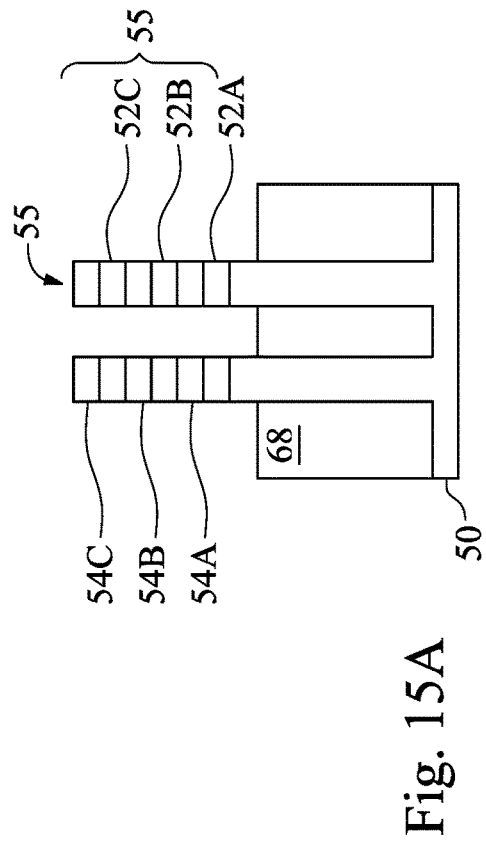
Figure 15B:
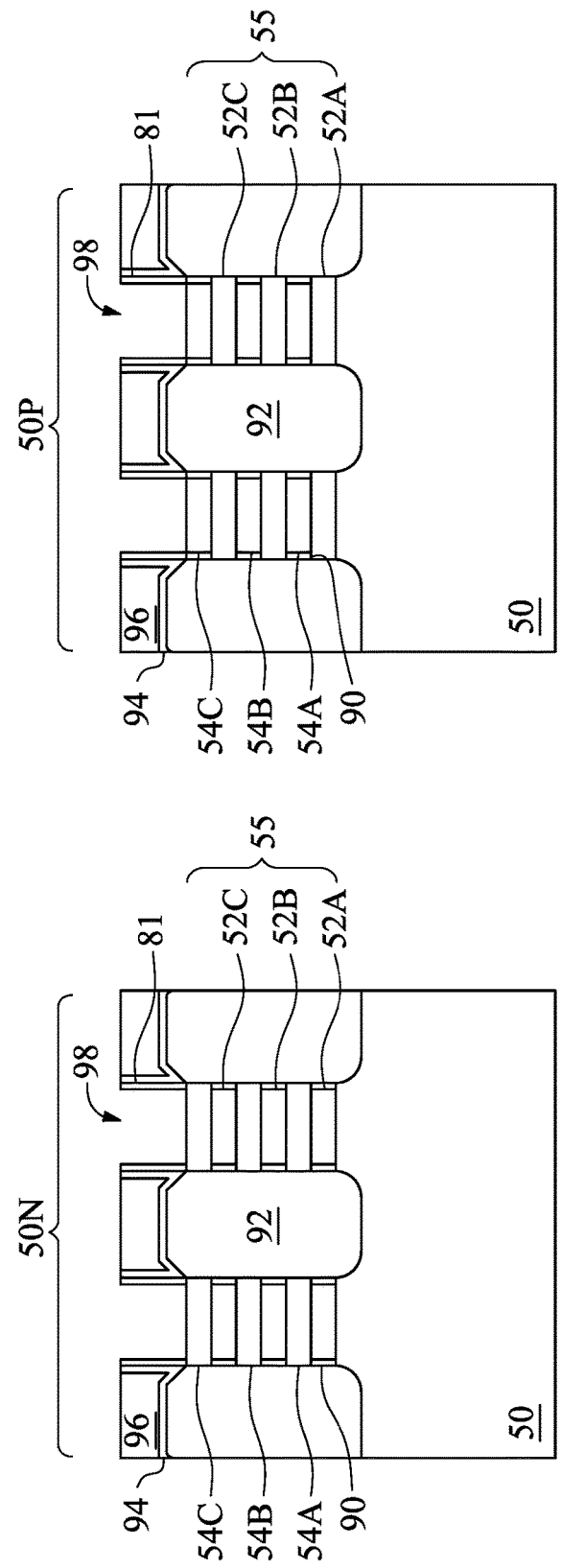

In FIGS. 15A and 15B, the dummy gates 76, and the masks 78 if present, are removed in one or more etching steps, so that second recesses 98 are formed. Portions of the dummy dielectric layers 70 in the second recesses 98 are also be removed. In some embodiments, the dummy gates 76 and the dummy dielectric layers 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 71 may be used as etch stop layers when the dummy gates 76 are etched. The dummy dielectric layers 71 may then be removed after the removal of the dummy gates 76.

In FIGS. 15A and 15B, the dummy gates 76, and the masks 78 if present, are removed in one or more etching steps, so that second recesses 98 are formed. Portions of the dummy dielectric layers 60 in the second recesses 98 are also be removed. In some embodiments, the dummy gates 76 and the dummy dielectric layers 60 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gates 76 are etched. The dummy dielectric layers 60 may then be removed after the removal of the dummy gates 76.

Figure 16A:
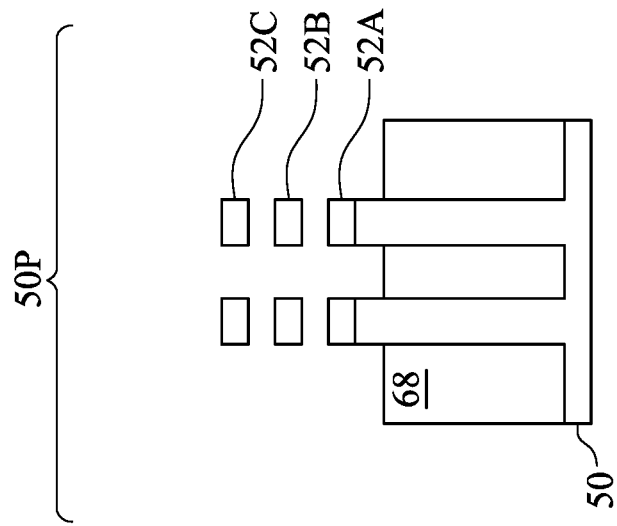
Figure 16A:
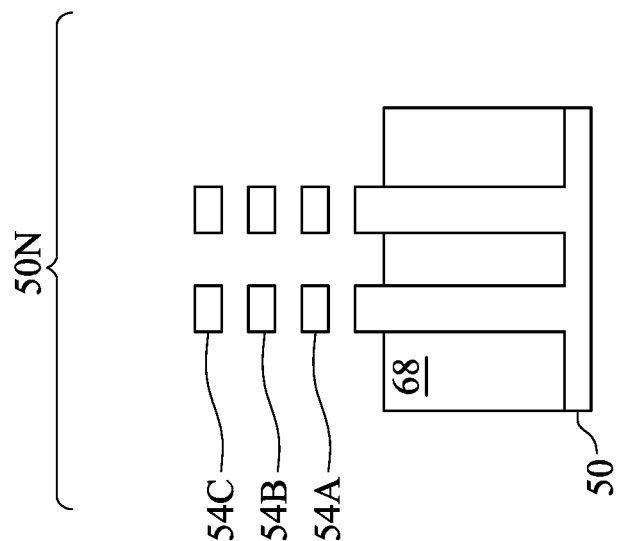
Figure 16B:
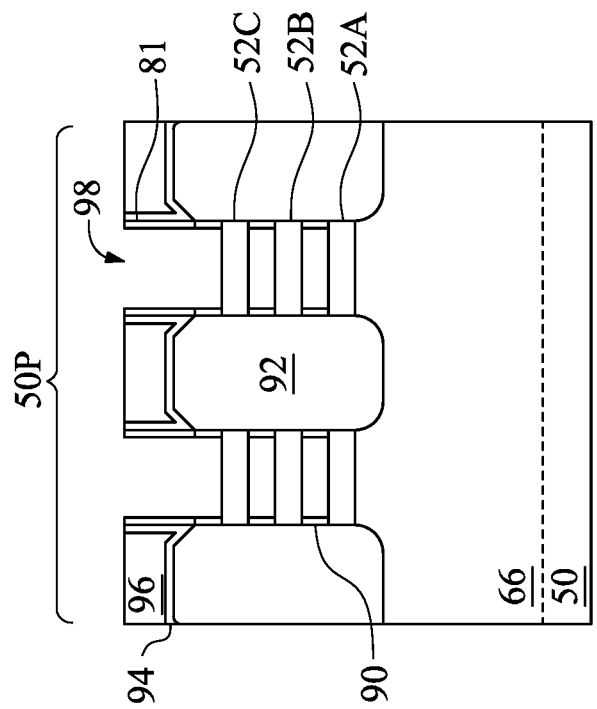
Figure 16B:
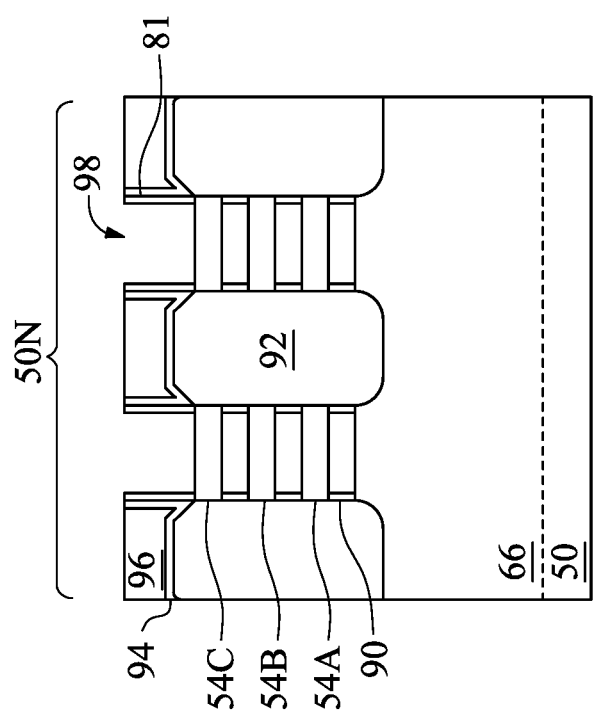

In FIGS. 16A and 16B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nano-FETs and p-type nano-FETS may have a same material composition, such as silicon, silicon germanium, or the like. FIGS. 25A, 25B, and 25C illustrate a structure resulting from such embodiments where the channel regions in both the p-type region 50P and the n-type region 50N are provided by the second nanostructures 54 and comprise silicon, for example.

Figure 17A:
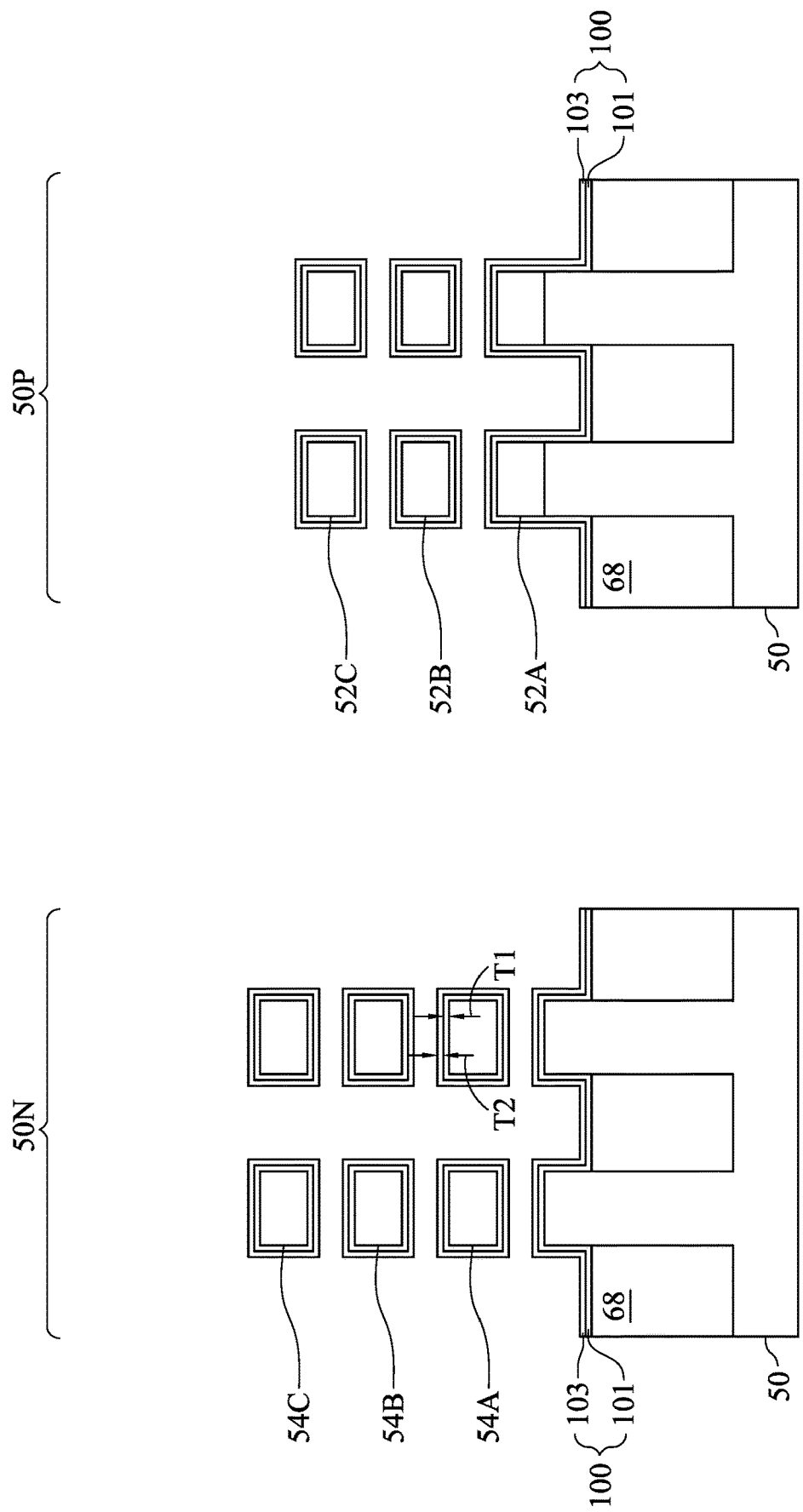
Figure 17B:
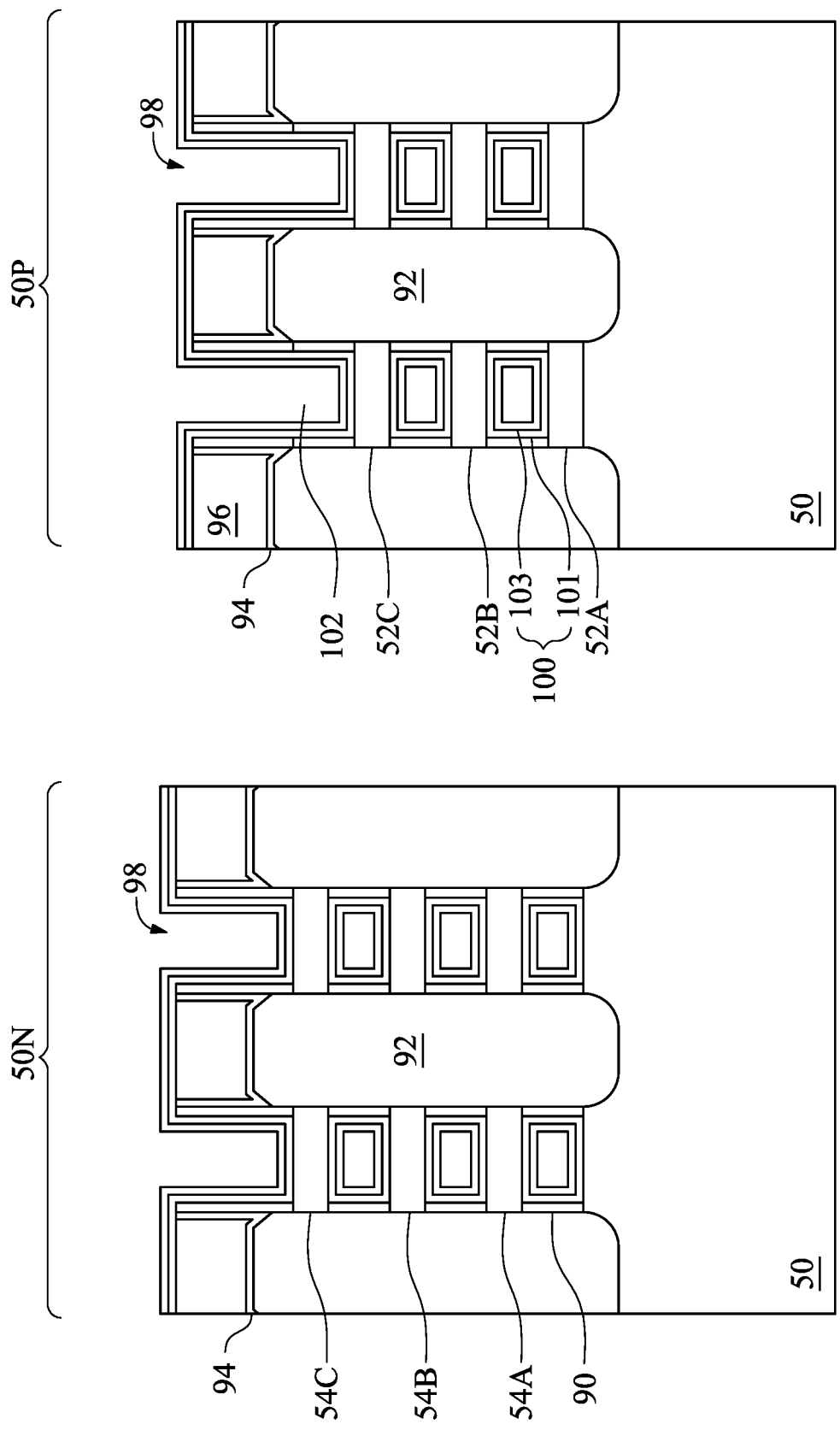

In FIGS. 17A and 17B, gate dielectric layers 100 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52. The gate dielectric layers 100 may also be deposited on top surfaces of the first ILD 96, the CESL 94, the first spacers 81, and the STI regions 68.

Figure 17C:
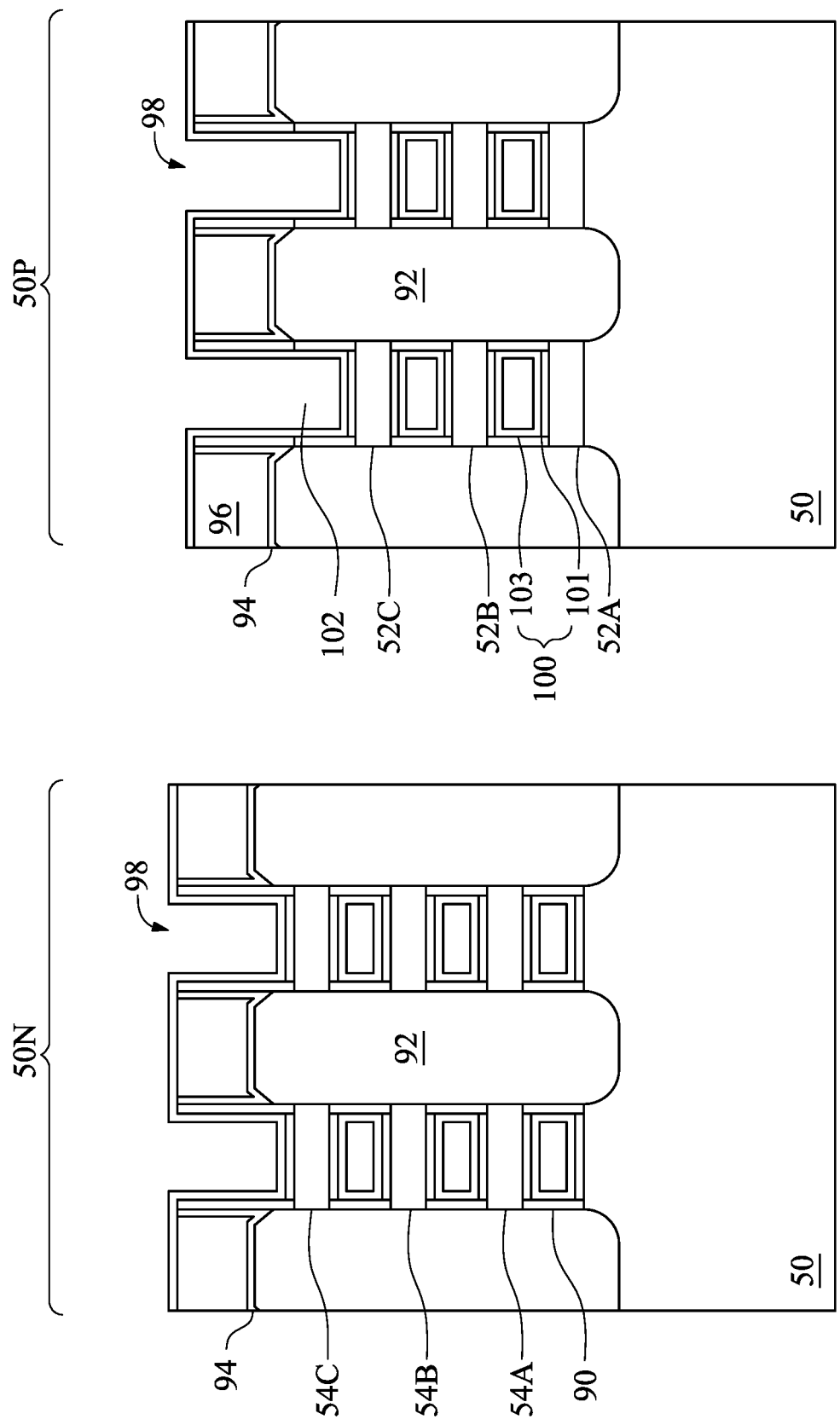

In accordance with some embodiments, the gate dielectric layers 100 comprise one or more dielectric layers, such as an oxide, a metal oxide, the like, or combinations thereof. For example, in some embodiments, the gate dielectric layers 100 may comprise an interfacial layer 101 (e.g., a silicon oxide layer or the like) and a high-k gate dielectric layer 103 (e.g., a metal oxide layer) over the interfacial layer 101. In some embodiments, the a high-k gate dielectric layer 103 have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like. In some embodiments, a thickness T1 of the interfacial layer 101 may be in a range of about 7 Å to about 25 Å, and a thickness T2 of the high-k gate dielectric layer 103 may be in a range of about 7 Å to about 35 Å. The interfacial layer 101 and/or the high-k gate dielectric layer 103 may have different thicknesses in other embodiments. In the illustrated embodiment, the interfacial layer 101 may be deposited using a conformal deposition process. In other embodiments, the interfacial layer 101 may be formed by a selective growth process to only be disposed on surfaces of the nanostructures (e.g., the nanostructures 52/54) using a thermal oxidation process, for example. FIG. 17C illustrates an alternative embodiment where the interfacial layer 101 is thermally grown, which can be applied to all subsequent embodiments of gate electrode formation.

The formation of the gate dielectric layers 100 in the n-type region 50N and the p-type region 50P may occur simultaneously such that the gate dielectric layers 100 in each region are formed from the same materials. In some embodiments, the gate dielectric layers 100 in each region may be formed by distinct processes, such that the gate dielectric layers 100 may be different materials and/or have a different number of layers. Various masking steps may be used to mask and expose appropriate regions when using distinct processes.

In FIGS. 18A through 21D, gate electrodes 102P and 102N (see FIGS. 20A, 20B, 21A, and 21B) are formed in the p-type region 50P and the n-type region 50N, respectively, over the gate dielectric layers 100 and filling the remaining portions of the second recesses 98. The formation of the gate electrodes 102 in the n-type region 50N and the p-type region 50P may occur simultaneously such that the gate electrodes 102 in each region are formed from the same materials. In some embodiments, the gate electrodes 102 in each region may be formed by distinct processes, such that the gate electrodes 102 may be different materials and/or have a different number of layers. Various masking steps may be used to mask and expose appropriate regions when using distinct processes. FIGS. 18A through 20B illustrate cross-sectional views of forming various layers of the gate electrodes 102 in the p-type region 50P, and FIGS. 21A through 21D illustrate cross-sectional views of the completed gate electrodes 102 in the n-type region 50N.

The gate electrodes 102 may include a metal-containing material such as titanium nitride, titanium oxide, tantalum nitride, cobalt, ruthenium, aluminum, tungsten, combinations thereof, or multi-layers thereof. Further, the gate electrodes 102 may include one or more layers of a metal carbide, such as a transition metal carbide, which allows for increased work function tuning flexibility.

Figure 18A:
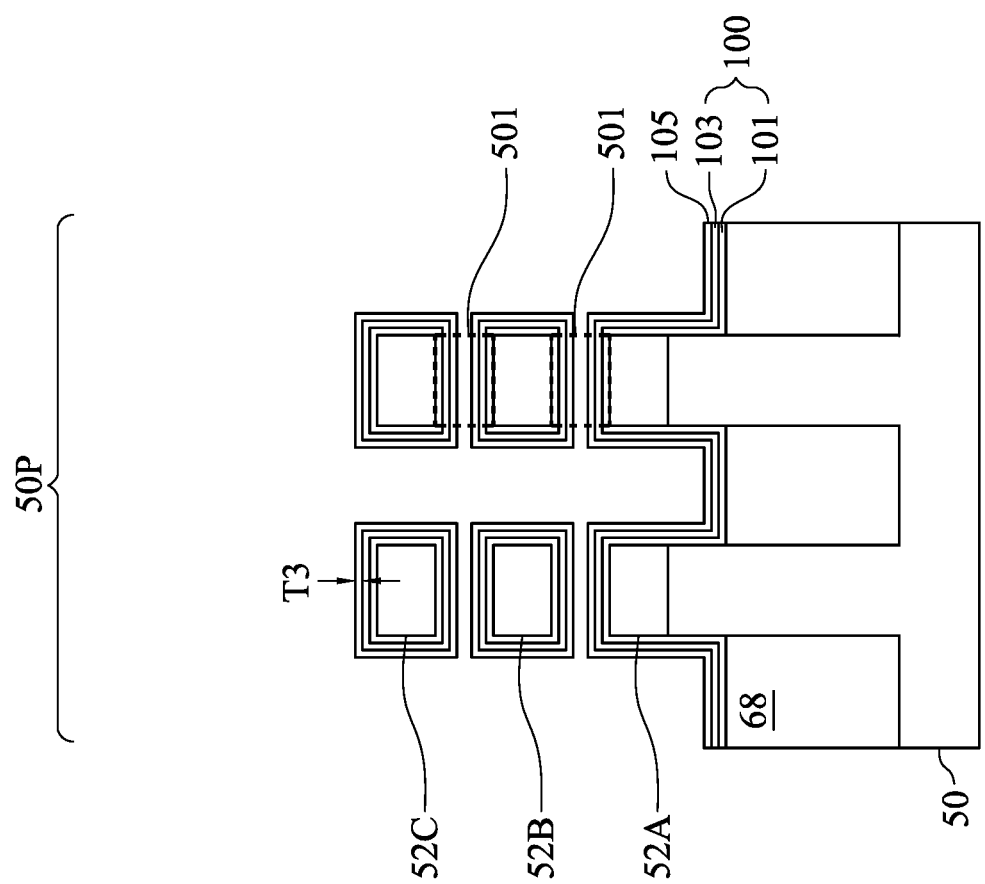
Figure 18B:
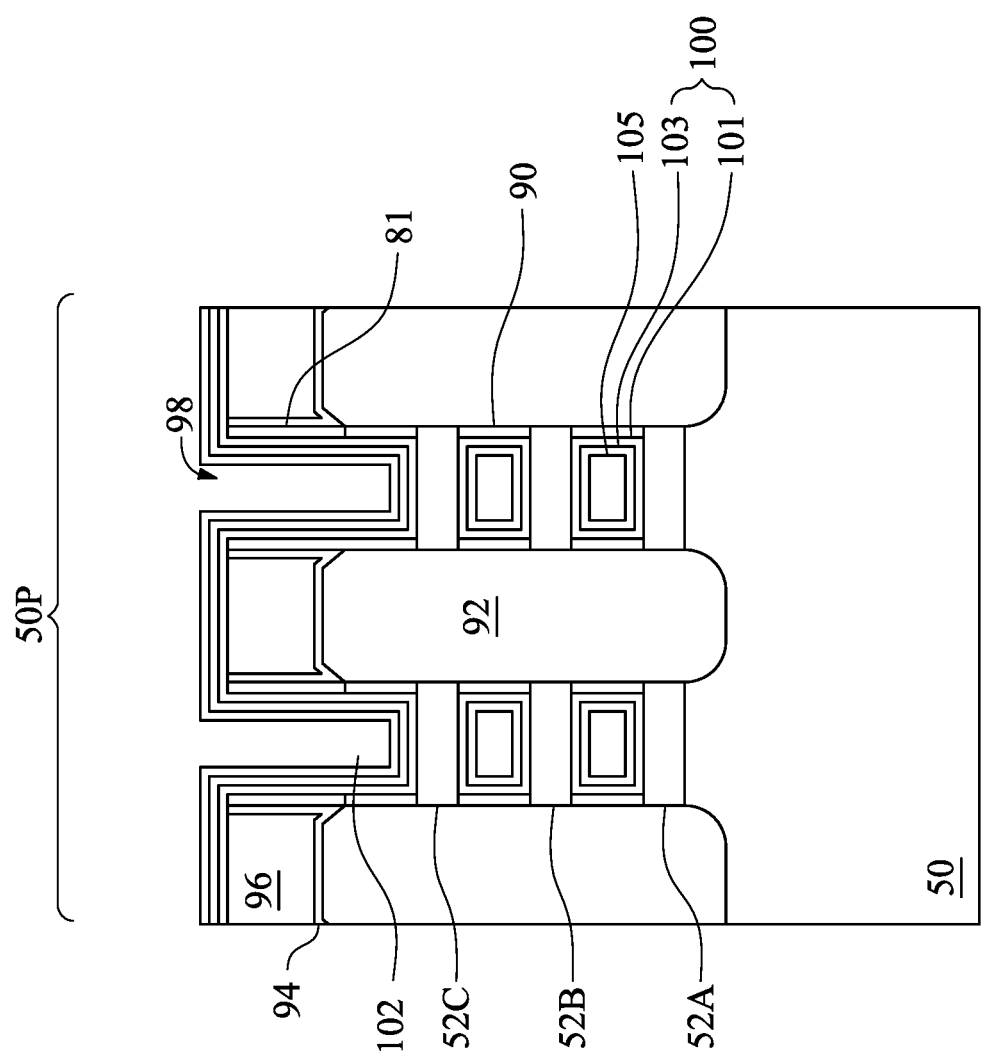

Referring to FIGS. 18A and 18B, an optional work function metal layer 105 is deposited on the gate dielectric layers 100 (e.g., on the high-k gate dielectric layer 103). The work function metal layer 105 may be deposited to surround each of the nanostructures (e.g., the nanostructures 52), and the work function metal layer 105 may further be deposited in an inner sheet region 501 between adjacent ones of the stacked nanostructures (e.g., between the nanostructures 52A/52B and/or the nanostructures 52B/52C). In some embodiments, the work function metal layer 105 is a metal nitride layer, such as, a titanium nitride (TiN) layer. The formation methods of the work function metal layer 105 may include CVD, ALD, PVD, or the like. In embodiments where the work function metal layer 105 is a titanium nitride layer deposited by ALD, a titanium-comprising precursor (e.g., TiCl$_4$, or the like) and a nitrogen-comprising precursor (e.g., NH$_3$) may be used to form a plurality of monolayers of titanium nitride. The work function metal layer 105 may be have a thickness T3 in a range of about 5 Å to about 15 Å. Advantages may be achieved by including the work function metal layer 105 comprising a metal nitride (e.g., titanium nitride) directly on the high-k gate dielectric layer 103. For example, the metal nitride material of the work function metal layer 105 may provide a more stable interface with the high-k gate dielectric layer 103 with fewer dangling bonds, particularly when the work function metal layer 105 has a thickness in the above thickness range. In other embodiments, the work function metal layer 105 may be omitted at a cost of reduced stability (e.g., more dangling bonds, see FIGS. 26A-26C).

Figure 26A:
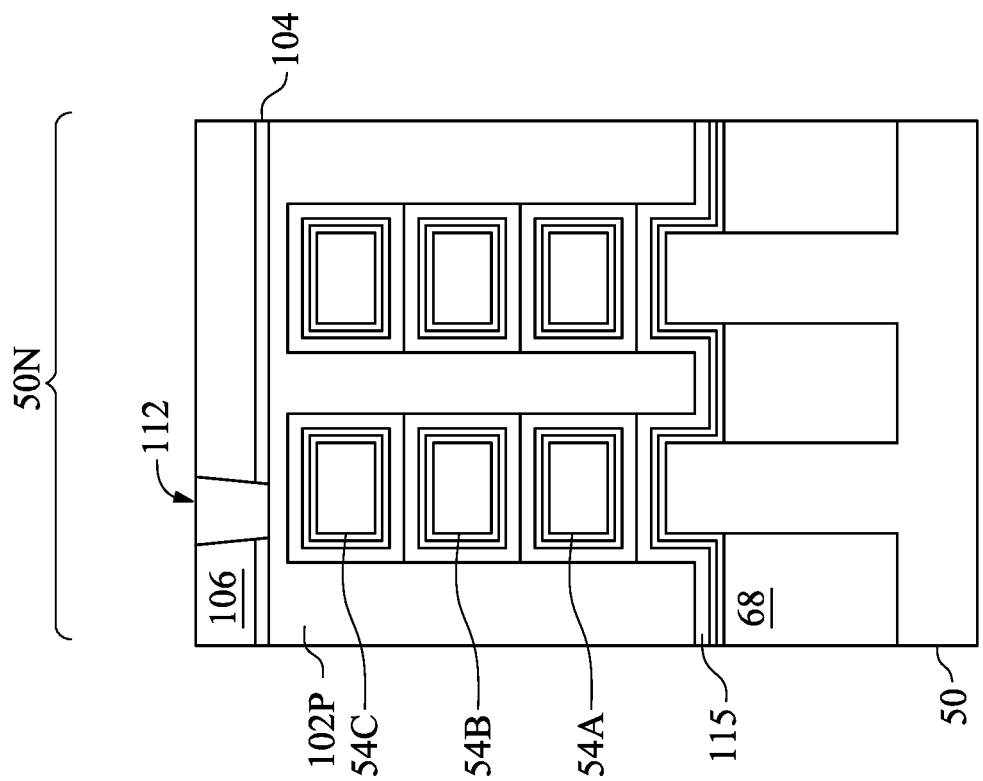
FIGS. 26A, 26B, and 26C are cross-sectional views of a nano-FET, in accordance with some embodiments.
Figure 26A:
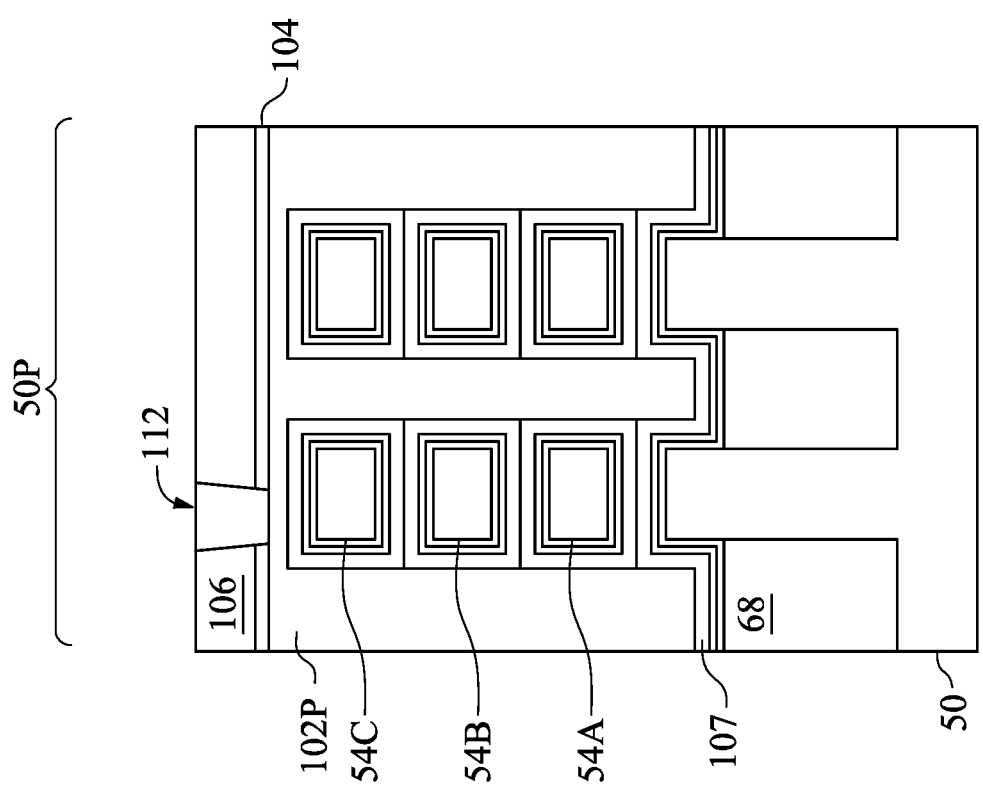
Figure 26B:
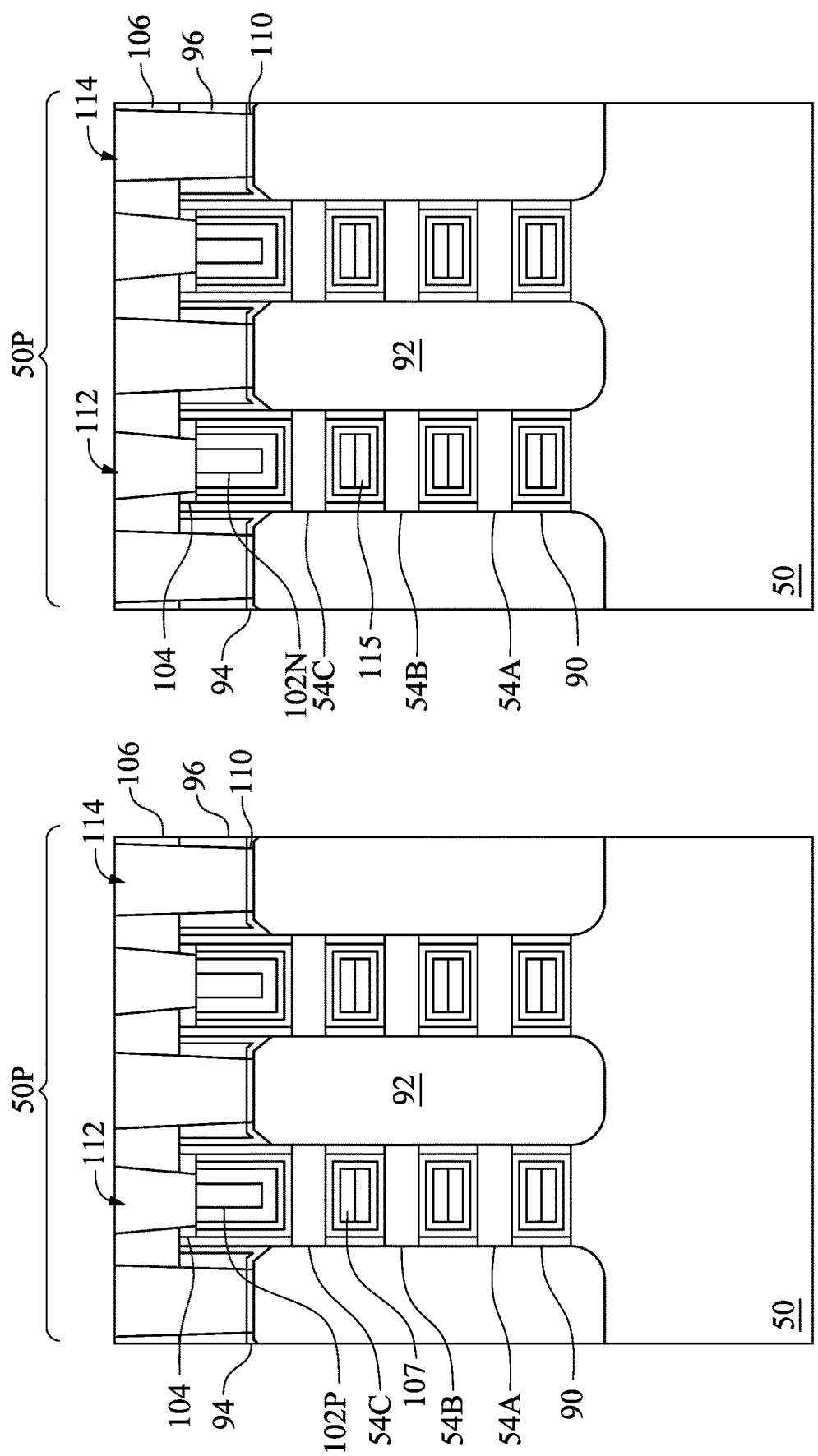
Figure 26C:
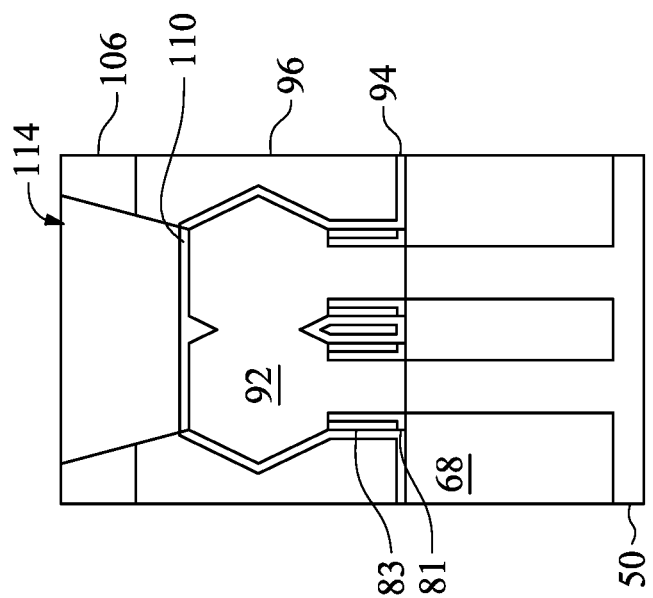

In FIGS. 19A through 19D, a work function metal layer 107 is deposited on the work function metal layer 105 (if present) or on the high-k gate dielectric layer 103 if the work function metal layer 105 is omitted (see FIGS. 26A-26C). The work function metal layer 107 may be deposited to surround each of the nanostructures (e.g., the nanostructures 52), and the work function metal layer 107 may further be deposited in the inner sheet region 501 between adjacent ones of the stacked nanostructures (e.g., between the nanostructures 52A/52B and/or the nanostructures 52B/52C). In some embodiments, a combination of the gate dielectric layers 100, the work function metal layer 105, and the work function metal layer 107 may completely fill the inner sheet region 501 spanning from a first nanostructure 52 to a second nanostructure 52. In some embodiments (e.g., where the work function metal layer 105 is omitted), a combination of the gate dielectric layers 100 and the work function metal layer 107 may completely fill the inner sheet region 501 spanning from a first nanostructure 52 to a second nanostructure 52 (see FIGS. 26A-26C). Other configurations are also possible.

Figure 19A:
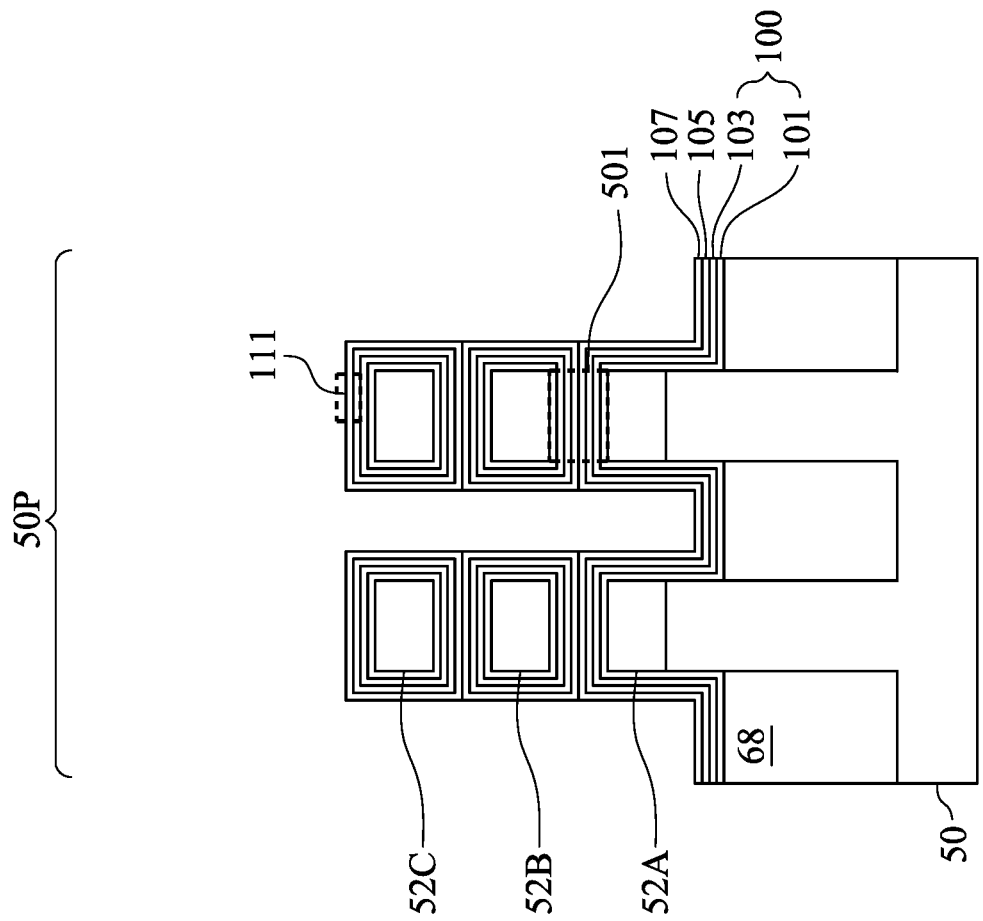
Figure 19B:
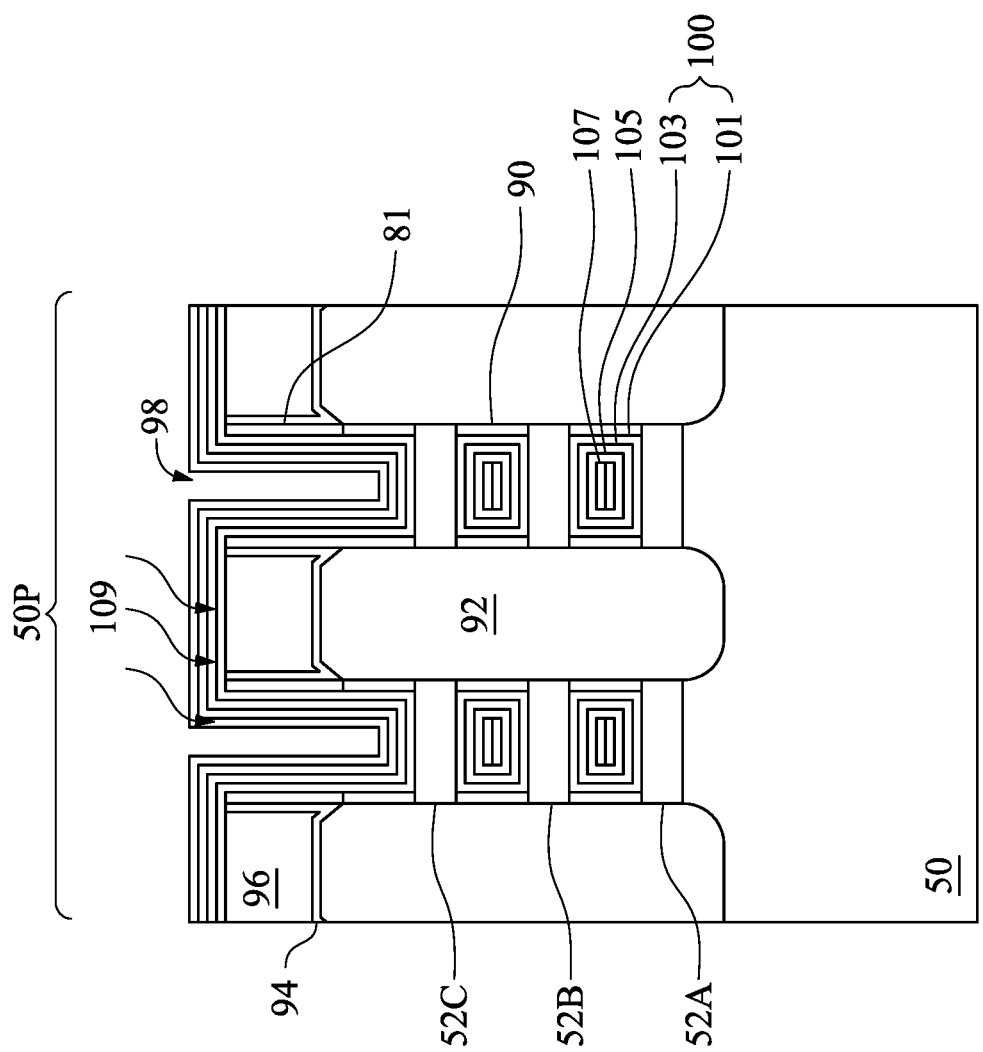
Figure 19D:
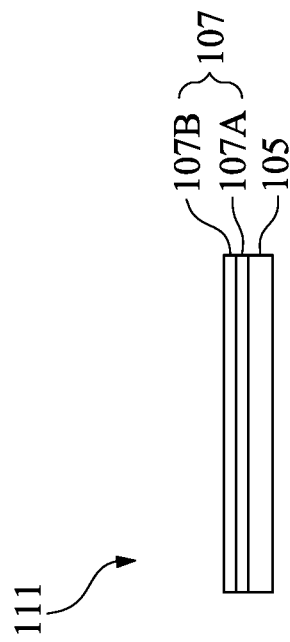
Figure 19C:
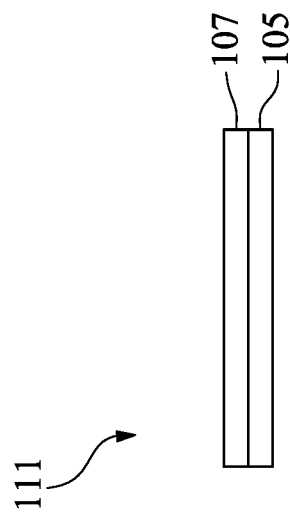

In some embodiments, the work function metal layer 107 is a metal carbide layer comprising carbon and Ce, Hf, V, Nb, Sc, Y, or Mo. By using a metal carbide layer with the above metals, improved flexibility in threshold voltage tuning can be achieved in the resulting device. FIGS. 19C and 19D illustrates detailed views of the work function metal layer 107 (e.g., of the region 111 in FIG. 19A). In some embodiments, as illustrated by FIG. 19C, the work function metal layer 107 is a single layer formed entirely of a metal carbide comprising Ce, Hf, V, Nb, Sc, Y, or Mo. In other embodiments, as illustrated by FIG. 19D, the work function metal layer 107 is a multilayer structure that each comprises a metal carbide. For example, the work function metal layer 107 includes a lower layer 107A comprising titanium carbide (TiC) or tantalum carbide (TaC), and an upper layer 107B comprising Ce, Hf, V, Nb, Sc, Y, or Mo. The lower layer 107A may be formed on the work function metal layer 105 (if present) or the gate dielectric layers 100, and the upper layer 107B may be formed on the lower layer 107B. The lower layer 107A comprising titanium or tantalum may facilitate the deposition process of the overlying upper layer 107B comprising Ce, Hf, V, Nb, Sc, Y, or Mo.

The formation methods of the work function metal layer 107 may include CVD, ALD, PVD, or the like. In some embodiments, the deposition process may be performed at a temperature in a range of about 125° C. to about 600° C. Performing the deposition process within the above temperature range may provide advantages. For example, performing the deposition process at a temperature less than 125° C. may result in the deposition precursors being unable to properly react and form the work function metal layer 107. Further, performing the deposition process at a temperature greater than 600° C. may result in poor film quality due to an excessive deposition rate resulting in unacceptable roughness of the work function metal layer 107. The deposition process may further be performed at a pressure in a range of 0.1 Torr and 70 Torr, for example. The work function metal layer 107 may be deposited in-situ (e.g., in a same chamber and without a break in vacuum environment) as the work function metal layer 105, or the work function metal layer 107 may be deposited ex-situ (e.g., in a different chamber and/or with an intervening break in vacuum environment) as the work function metal layer 105. In embodiments where the work function metal layer 107 is a multi-layer structure, each of the layers (e.g., layers 107A and 107B) may be formed according to the above processes.

In some embodiments, the deposition process work function metal layer 107 flows suitable precursors in order to form a work function metal layer 107 comprising the desired metal carbide(s). The precursors may include a carbon-comprising precursor (e.g., trimethylaluminum (TMA, Al(CH$_3$)$_3$ or the like). The precursors may further include a metal-comprising precursor, which may vary depending on the type of metal carbide being deposited. An example metal-comprising precursor for depositing a work function metal layer 107 comprising Ce, Hf, V, Nb, Sc, Y, or Mo include CeCl$_4$, HfCl$_4$, VCl$_3$, NbCl$_5$, ScCl$_4$, YCl$_x$, or MoCl$_x$, respectively, where 'x' denotes a positive integer. Further, example metal-comprising precursor for depositing a work function metal layer 107 comprising titanium or tantalum include TiCl$_4$ or TaCl$_5$, respectively. Other suitable precursors may be used in other embodiments.

Figure 20A:
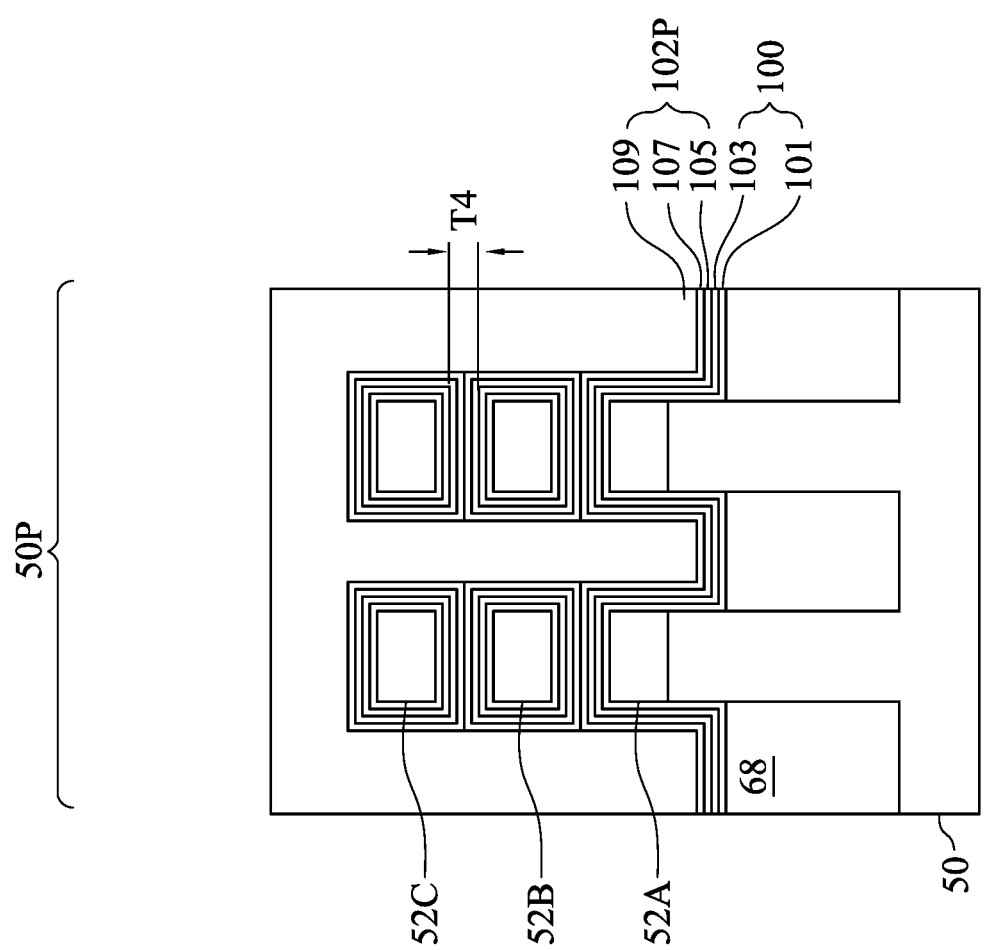
Figure 20B:
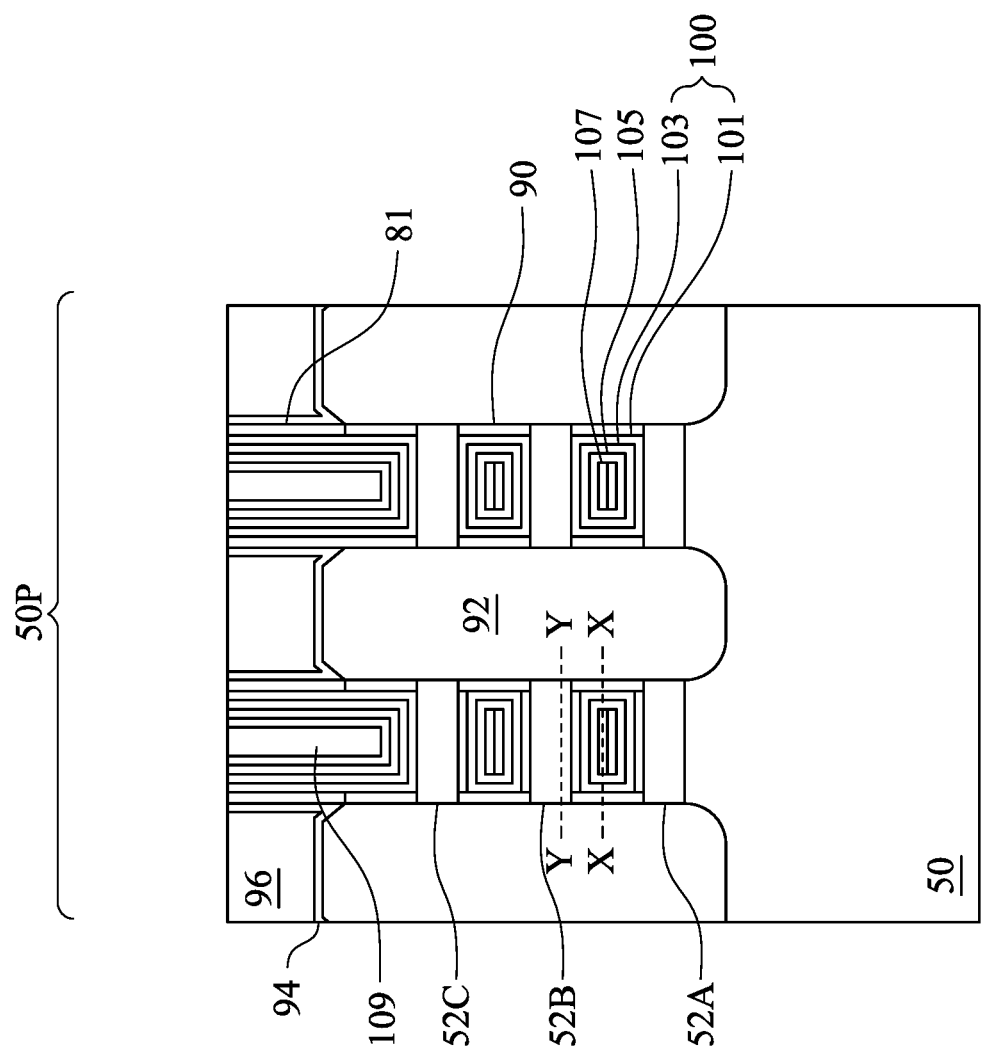

Next, in FIGS. 20A and 20B, a fill metal 109 is formed over the work function metal layer 107. The fill metal 109 may be a metal-containing material such as Co, Ru, Al, W, combinations thereof, multi-layers thereof, or the like. The formation of the fill metal 109 may include one or more deposition steps of the using CVD, ALD, PVD, or the like. The fill metal 109 may be a multi-layered structure or a singular layer. For example, in embodiments where the fill metal 109 comprises W, the fill metal 109 may comprise a fluorine free tungsten (FFW) layer and a low fluorine tungsten (LFW) layer over the FFW layer. A combination of the fill metal 109, the work function metal layer 107, and the work function metal layer 105 (if present) provides a gate electrode 102P in the p-type region 50P. The gate electrode 102P may have an inner sheet thickness T4 (e.g., spanning region between adjacent nanostructures 52) that is in a range of about 7 Å to about 25 Å in some embodiments.

Figure 20D:
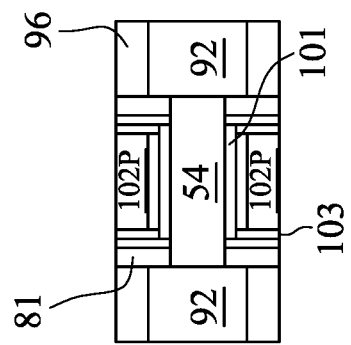
Figure 20C:
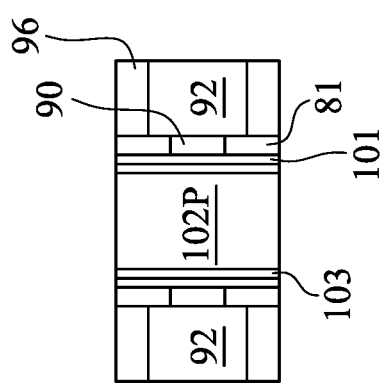

After the filling of the second recesses 98, a planarization process, such as a CMP, may be performed to remove the excess portions of the gate dielectric layers 100 and the material of the gate electrodes 102P, which excess portions are over the top surface of the first ILD 96. The remaining portions of material of the gate electrodes 102P and the gate dielectric layers 100 thus form replacement gate structures of the resulting nano-FETs. The gate electrodes 102P and the gate dielectric layers 100 may be collectively referred to as "gate structures." FIG. 20C illustrates a top-down view of the gate structure along line X-X of FIG. 20B. FIG. 20D illustrates a top-down view of the gate structure along line Y-Y of FIG. 20A.

Figure 21A:
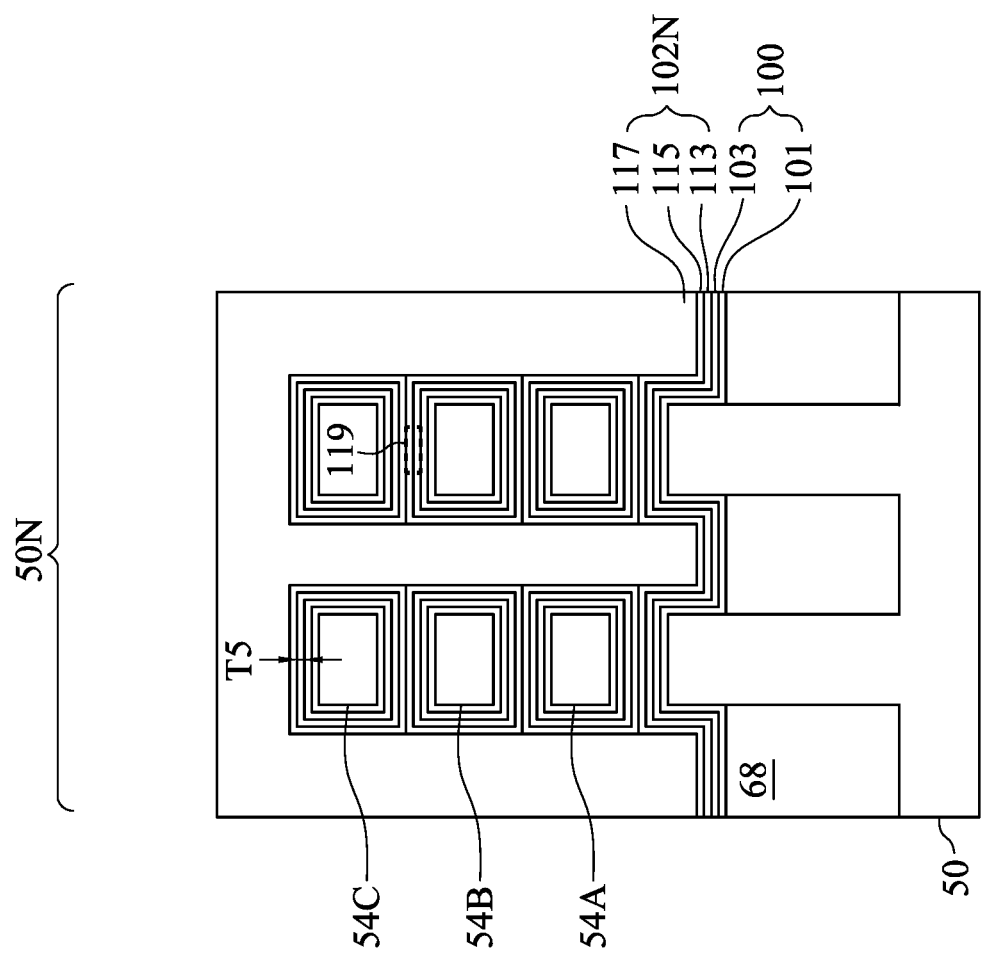
Figure 21B:
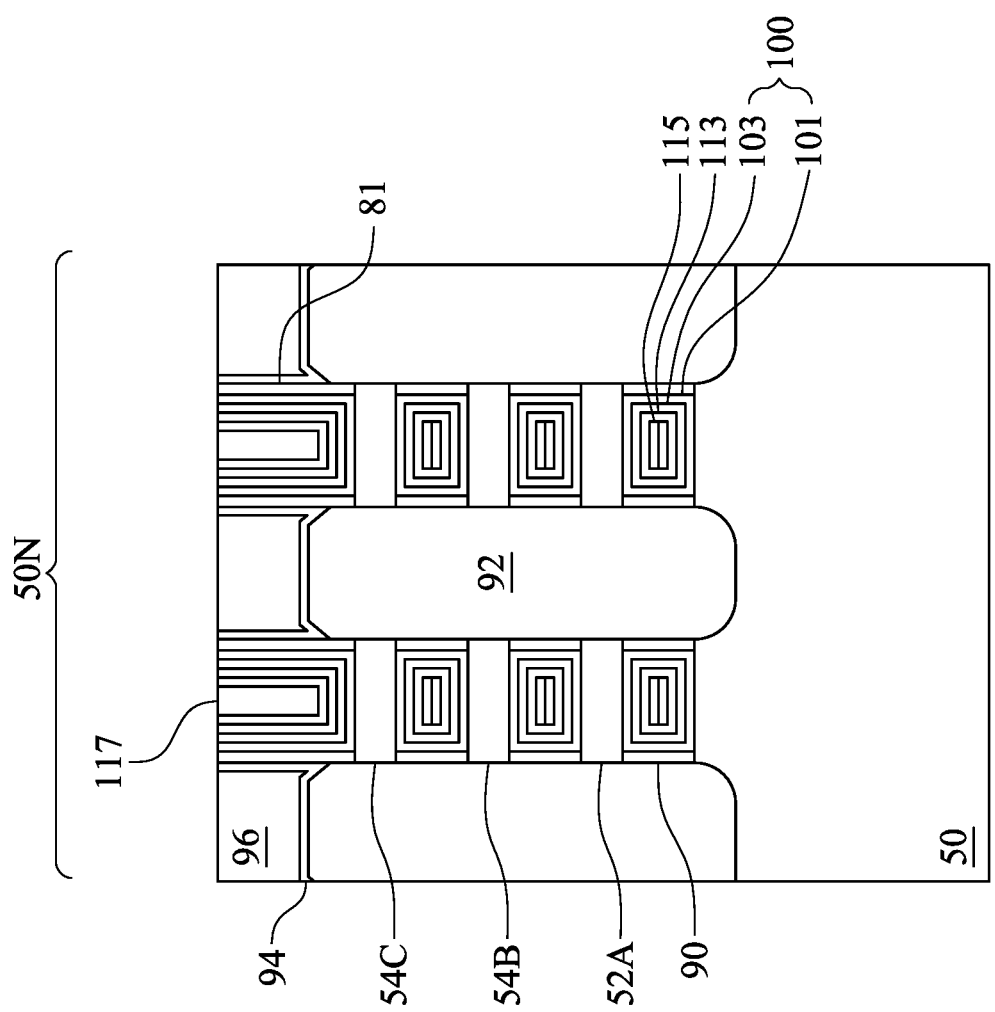
Figure 21D:
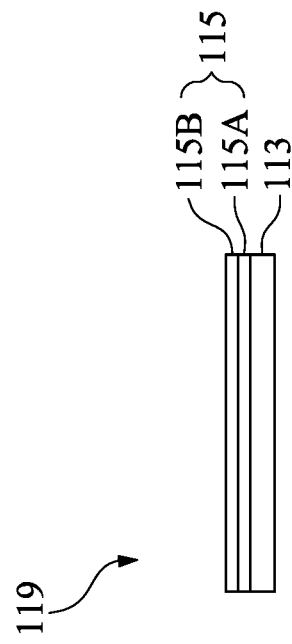
Figure 21C:
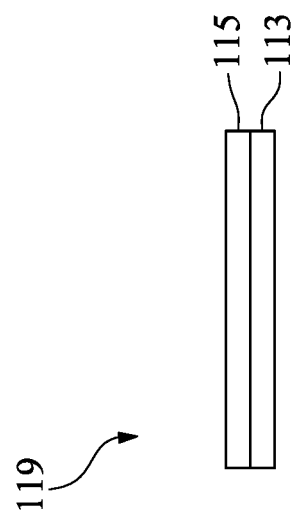

FIGS. 21A through 21D illustrate cross-sectional views of the gate structures (e.g., comprising the gate electrodes 102N and the gate dielectric layers 100) in the n-type regions 50N. FIGS. 21C and 21D illustrate detailed views of a region 119 of the FIG. 21A. The gate electrodes 102N may include an optional work function metal layer 113, a work function metal layer 115, and a fill material 117. The gate electrode 102N may have a thickness in a range of about 7 Å to about 25 Å in some embodiments.

The optional work function metal layer 113 is deposited over the gate dielectric layers 100. optional work function metal layer 113 may be a metal nitride layer, which is made of a similar material and using a similar process as described above with respect to the work function metal layer 105. The work function metal layer 113 may have a same or different material composition as the work function metal layer 105. The work function metal layer 113 may be have a thickness T5 in a range of about 5 Å to about 15 Å. Advantages may be achieved by including the work function metal layer 113 comprising a metal nitride (e.g., titanium nitride) directly on the high-k gate dielectric layer 103. For example, the metal nitride material of the work function metal layer 113 may provide a more stable interface with the high-k gate dielectric layer 103 with fewer dangling bonds, particularly when the work function metal layer 113 has a thickness in the above range. In other embodiments, the work function metal layer 113 may be omitted at a cost of reduced stability (e.g., more dangling bonds, FIGS. 26A-26C).

The work function metal layer 115 is deposited over the work function metal layer 113 (if present) and the gate dielectric layer 100. The work function metal layer 115 may be one or more metal carbide layer(s), which comprises a similar material and is made from a similar process as described above with respect to the work function metal layer 107. For example, the work function metal layer 115 may comprise Ce, Hf, V, Nb, Sc, Y, or Mo. The work function metal layer 115 may be a singular layer (e.g., as illustrated by FIG. 21C) or a multilayer structure comprising a lower layer 115A and an upper layer 115B. The lower layer 115 may be a metal carbide layer comprising Ti or Ta, and the upper layer 115B may be a metal carbide layer comprising Ce, Hf, V, Nb, Sc, Y, or Mo. The lower layer 115A may facilitate growth of the upper layer 115B. At least one of the work function metal layer 113 or 115 may further provide an n-type work function metal layer, which comprises an n-type metal (e.g., aluminum or the like). For example, the work function metal layer 115 may include an metal carbide layer comprising an alloy of carbon, aluminum, and Ti, Ta, Ce, Hf, V, Nb, Sc, Y, or Mo.

The fill material 117 may be formed of a similar material and formed using a similar process as described above with respect to the fill metal 109. The fill material 117 may have a same or different material composition as the fill metal 109.

Figure 22A:
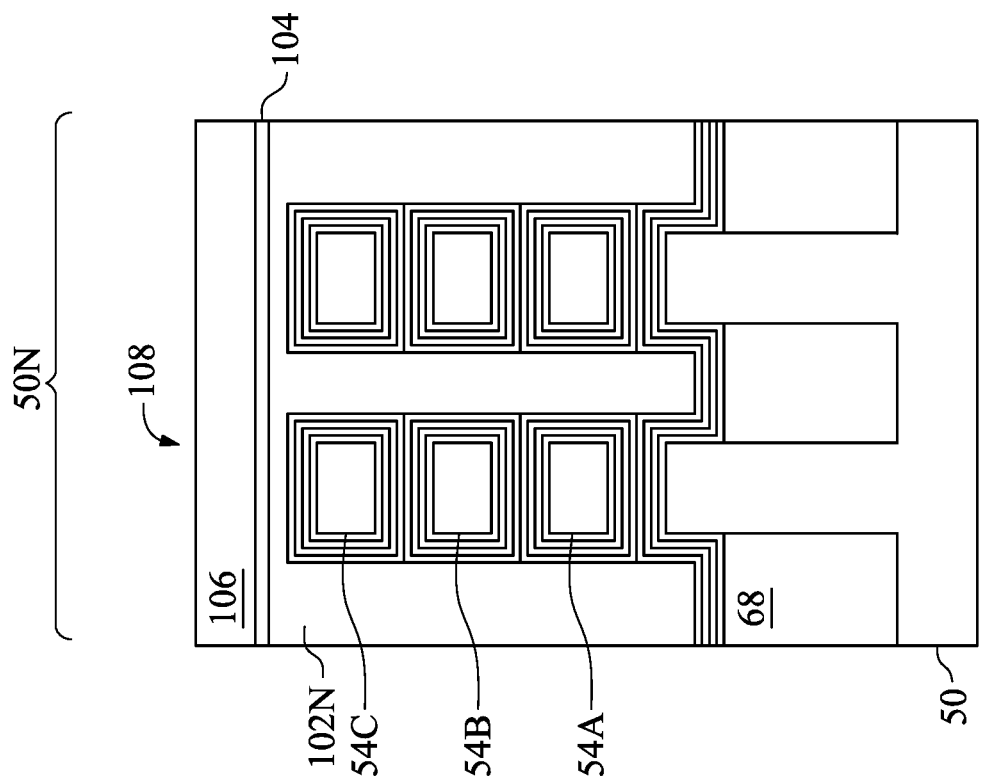
Figure 22A:
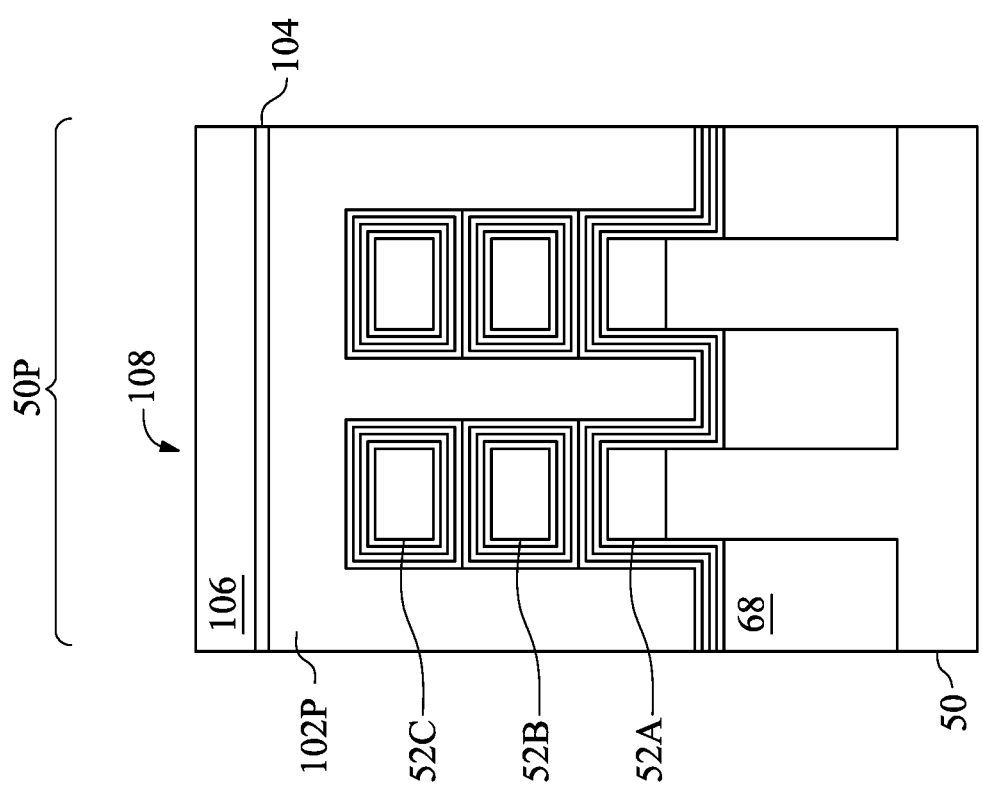
Figure 22B:
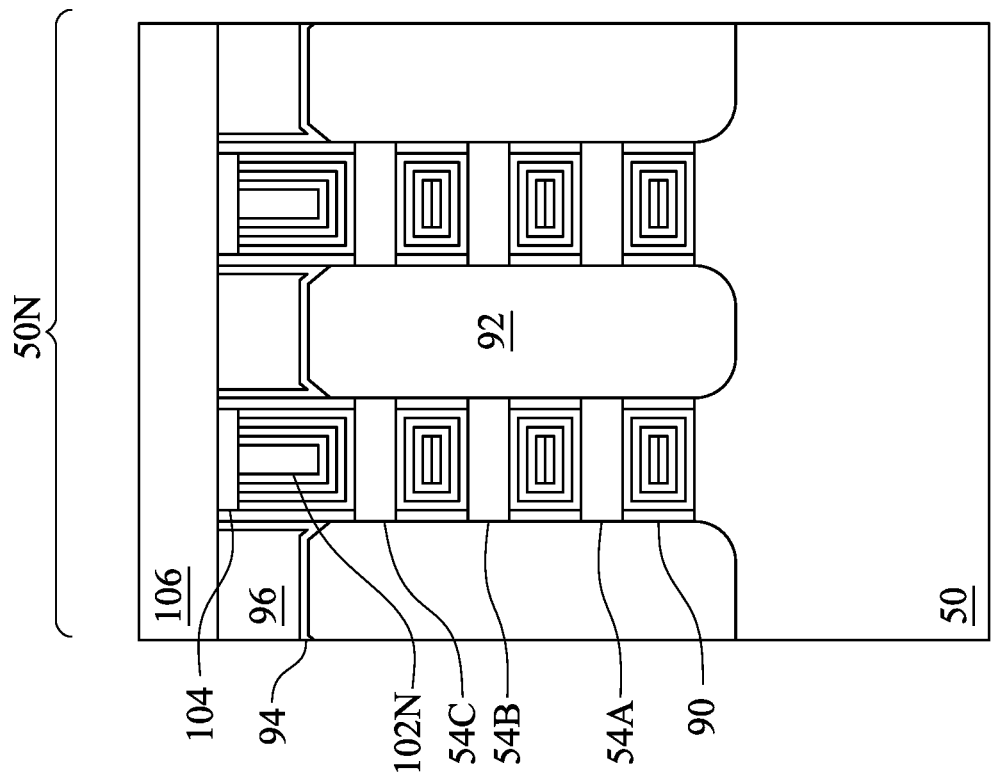
Figure 22B:
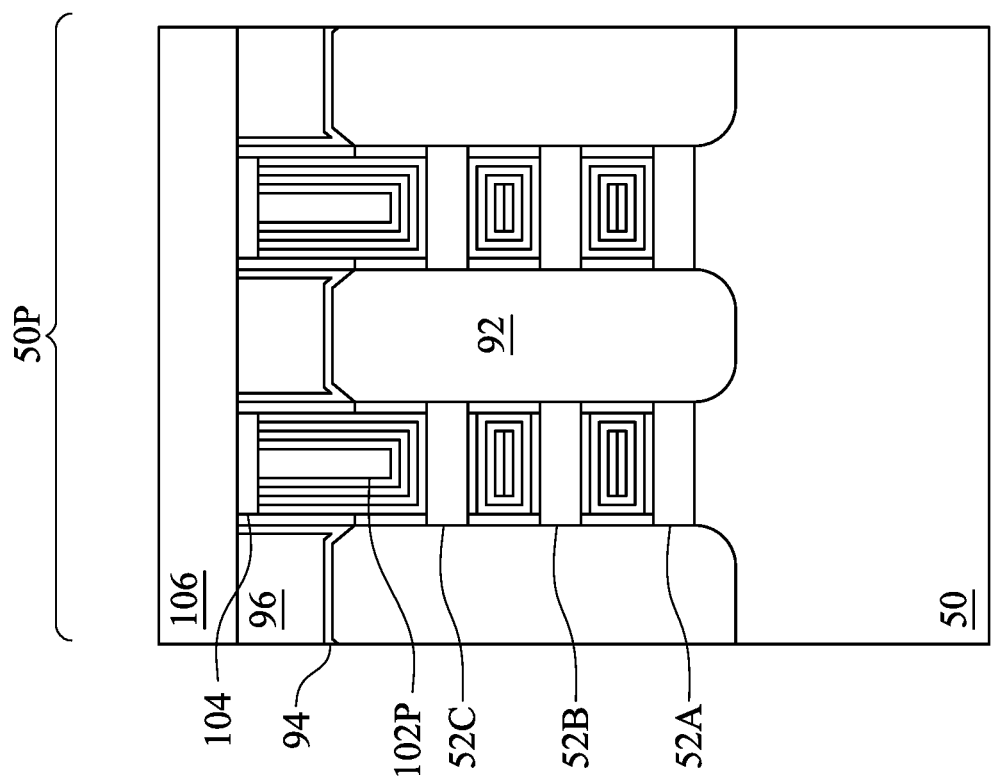

In FIGS. 22A-22C, the gate structure (including the gate dielectric layers 100 and the corresponding overlying gate electrodes 102N/102P) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 24A and 24B) penetrate through the gate mask 104 to contact the top surface of the recessed gate electrodes 102.

As further illustrated by FIGS. 22A-22C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 23A:
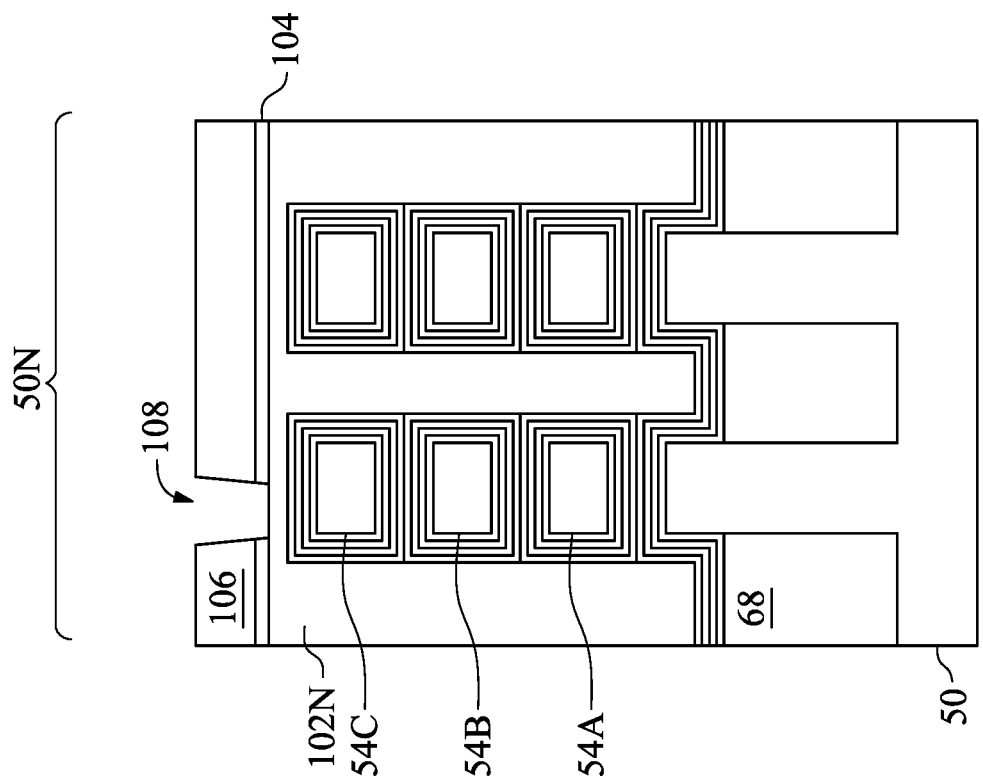
Figure 23A:
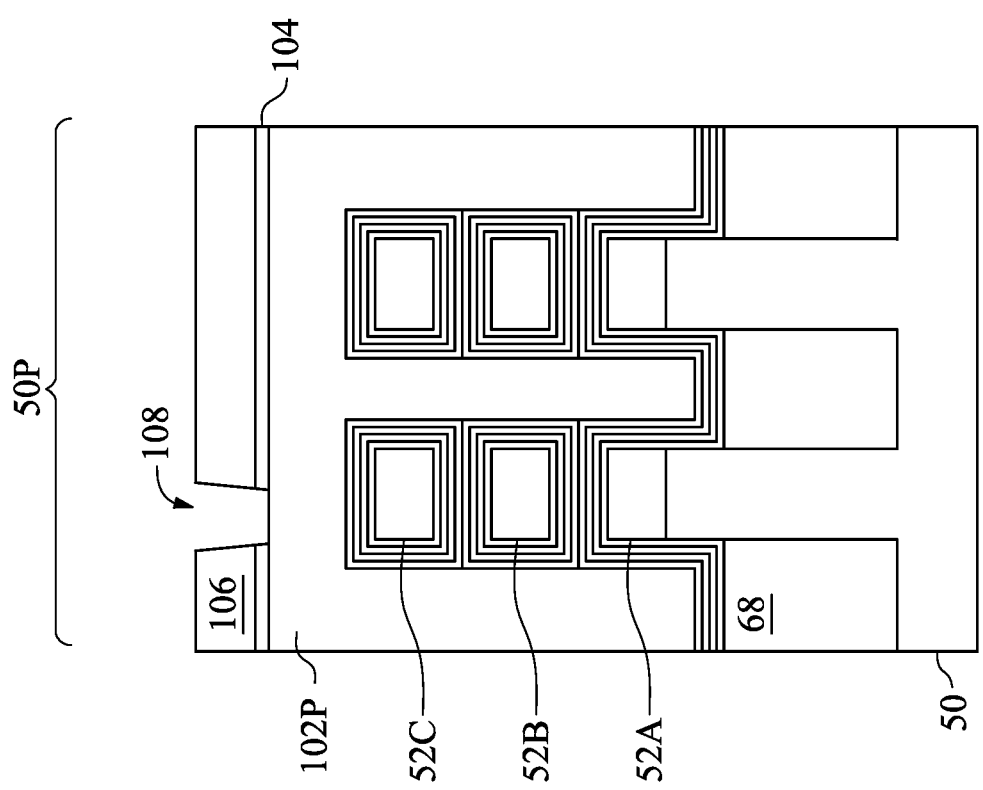
Figure 23B:
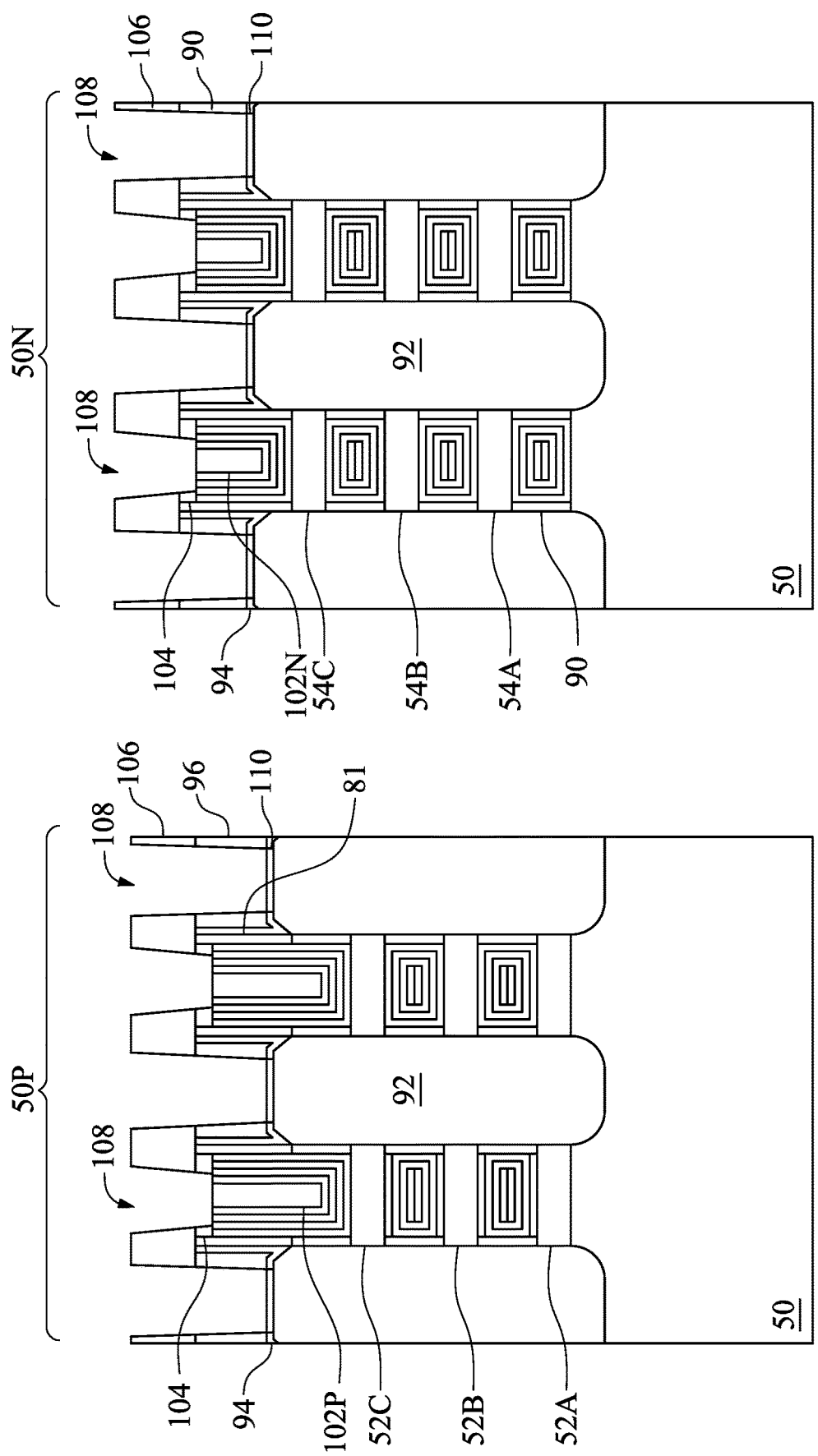
Figure 23C:
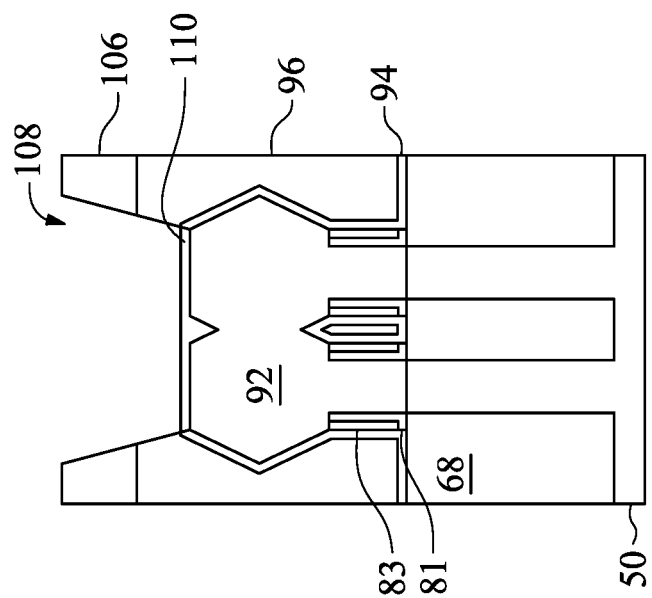

In FIGS. 23A-23C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 23B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 24A:
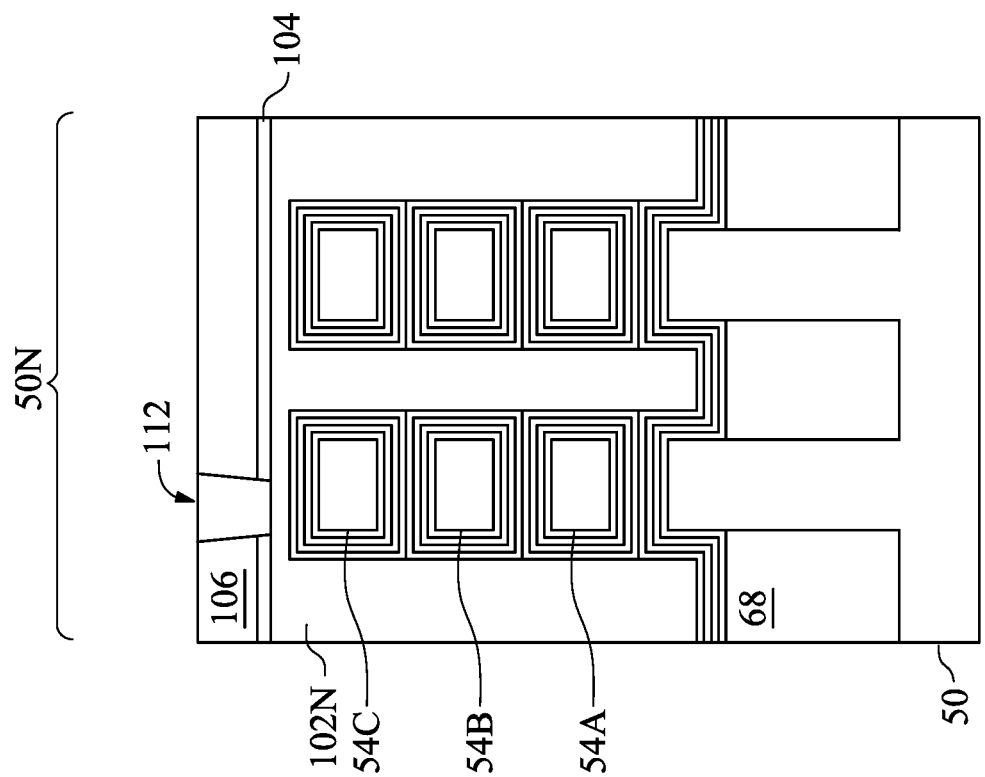
Figure 24A:
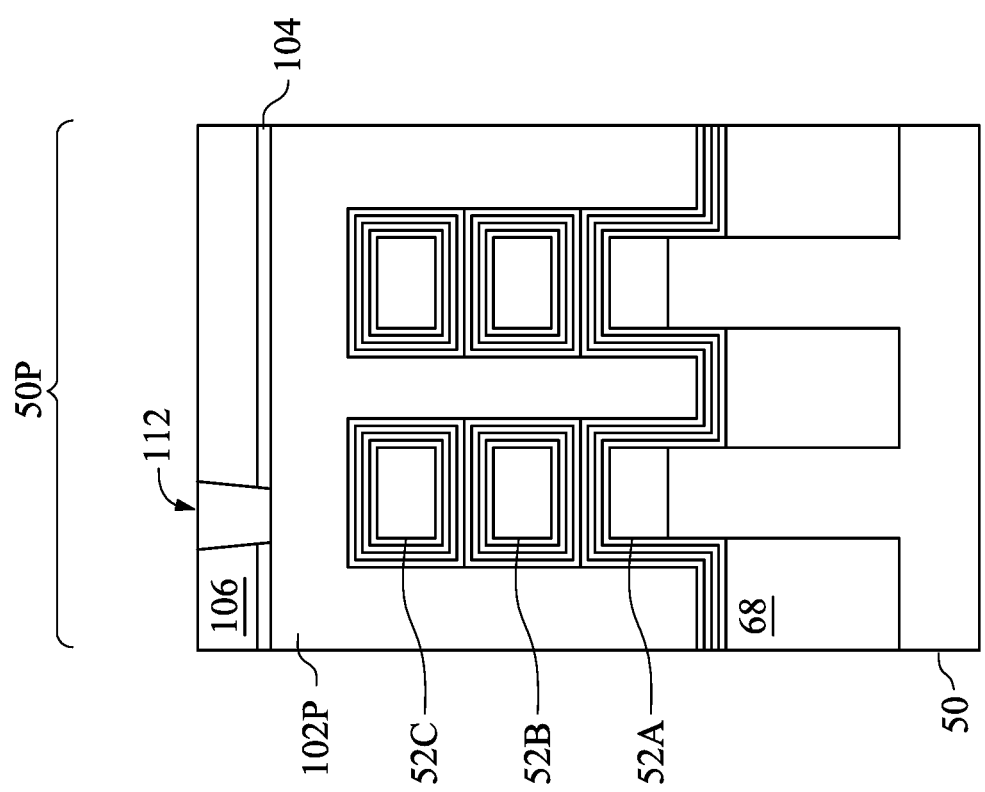
Figure 24B:
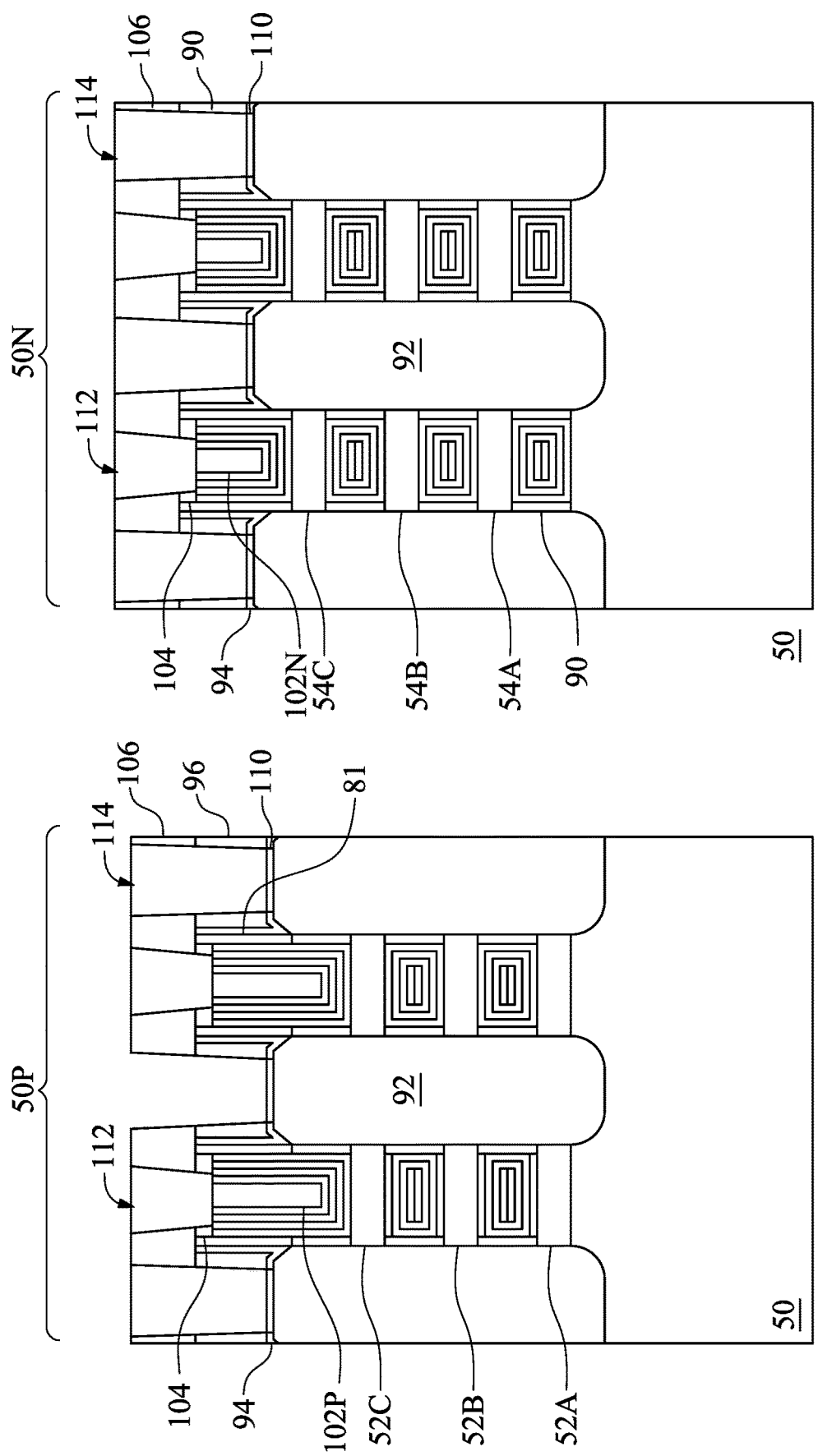
Figure 24C:
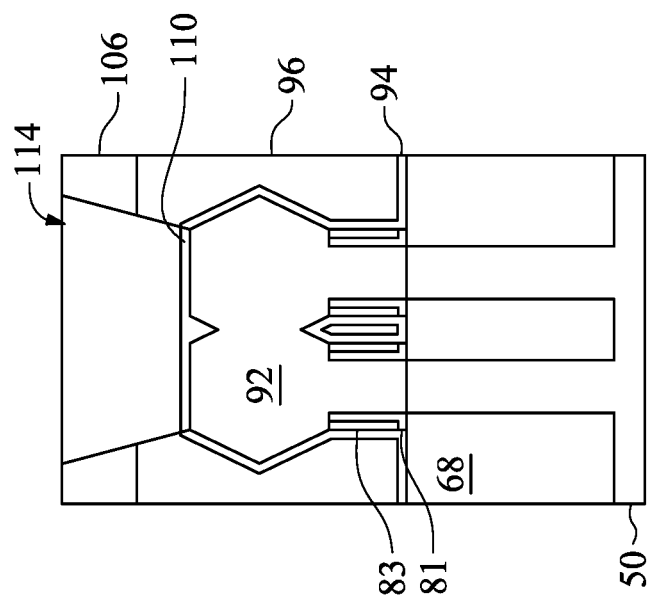

Next, in FIGS. 24A-24C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material, and is electrically coupled to the underlying conductive feature (e.g., gate structure 102 and/or silicide region 110 in the illustrated embodiment). The contacts 112 are electrically coupled to the gate structure 102 and may be referred to as gate contacts, and the contacts 114 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

Figure 29:
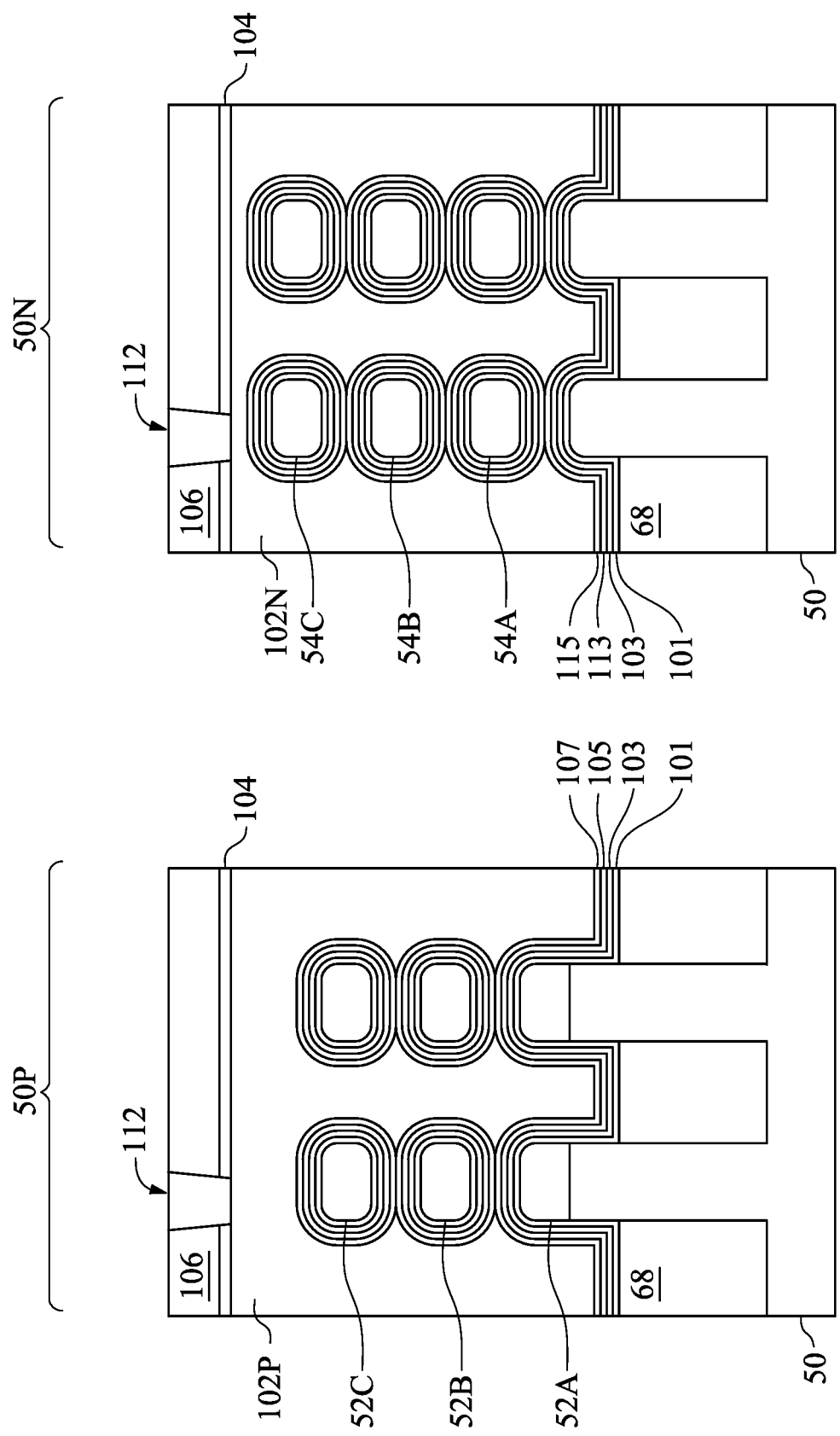
FIG. 29 is a cross-sectional view of a nano-FET, in accordance with some embodiments.

Thus, various transistor structures with metal carbide work function metal layers may be formed to provide improved flexibility in threshold voltage tuning. Although FIGS. 2 through 24C illustrate the transistor having a particular configuration, other configurations are also possible. For example, a shape of each of the nanostructures 52 and/or 54 may be different, such as rounded in other embodiments. The rounded shape may be achieved by adjusting the etching process(es) used to form the nanostructures 52/54. FIG. 29 illustrates a cross-sectional view along cross-section A-A of FIG. 1 where the nanostructures 52/54 have a rounded cross-section. Further additional or fewer work function metal layers may be included in each of the gate electrodes 102N/102P as described below.

FIGS. 25A-25C illustrate cross-sectional views of a device according to some alternative embodiments. FIG. 25A illustrates reference cross-section A-A' illustrated in FIG. 1. FIG. 25B illustrates reference cross-section B-B' illustrated in FIG. 1. FIG. 25C illustrates reference cross-section C-C' illustrated in FIG. 1. In FIGS. 25A-25C, like reference numerals indicate like elements formed by like processes as the structure of FIGS. 24A-24C. However, in FIGS. 25A-25C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 25A-25C may be formed, for example, by removing the first nanostructures 52 from both the p-type region 50P and the n-type region 50N simultaneously; depositing the gate dielectrics 100 and the gate electrodes 102P (e.g., gate electrode suitable for a p-type nano-FET) around the second nanostructures 54 in the p-type region 50P; and depositing the gate dielectrics 100 and the gate electrodes 102N (e.g., a gate electrode suitable for a n-type nano-FET) around the second nanostructures 54 in the n-type region 50N. In such embodiments, materials of the epitaxial source/drain regions 92 may be different in the n-type region 50N compared to the p-type region 50P as explained above.

FIGS. 26A-26C illustrate cross-sectional views of a device according to some alternative embodiments. FIG. 26A illustrates reference cross-section A-A' illustrated in FIG. 1. FIG. 26B illustrates reference cross-section B-B' illustrated in FIG. 1. FIG. 26C illustrates reference cross-section C-C' illustrated in FIG. 1. In FIGS. 26A-26C, like reference numerals indicate like elements formed by like processes as the structure of FIGS. 24A-24C. However, in FIGS. 26A-26C, the work function metal layers 105 and 113 (e.g., metal nitride layers) may be omitted, and channel regions in the n-type region 50N and the p-type region 50P comprise a same material. For example, the work function metal layer 107 and the gate dielectric layers 100 may collective fill an entire region between adjacent nanostructures 54 in the p-type region 50P, and the work function metal layer 115 and the gate dielectric layers 100 may collective fill an entire region between adjacent nanostructures 54 in the n-type region 50N.

Figure 27A:
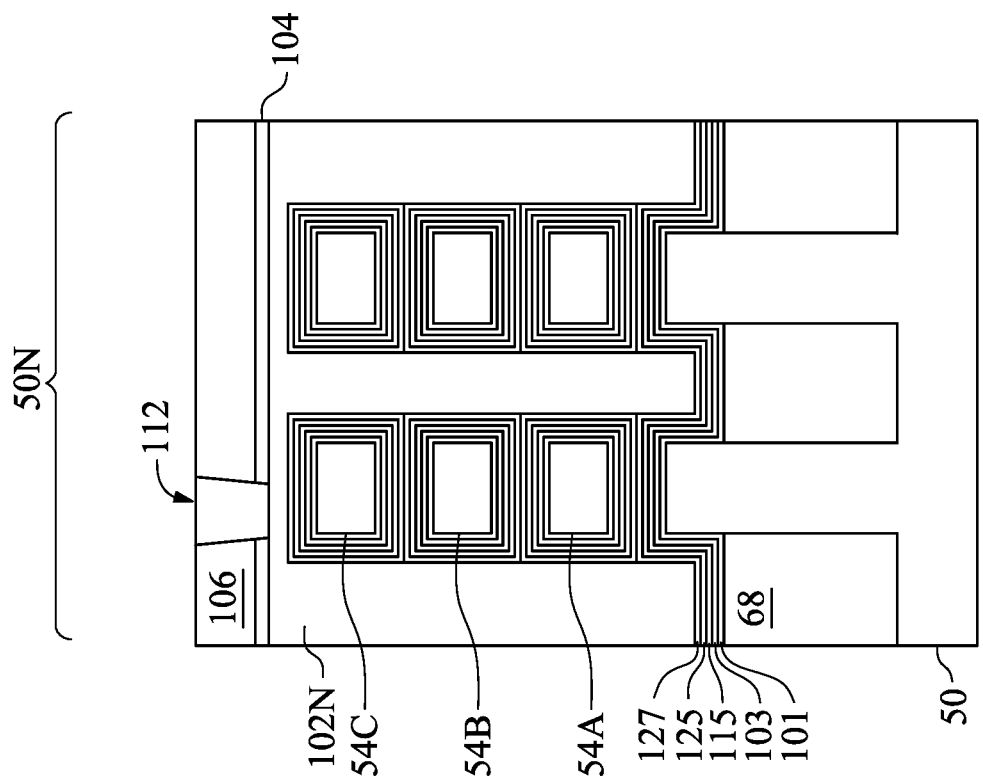
FIGS. 27A, 27B, and 27C are cross-sectional views of a nano-FET, in accordance with some embodiments.
Figure 27A:
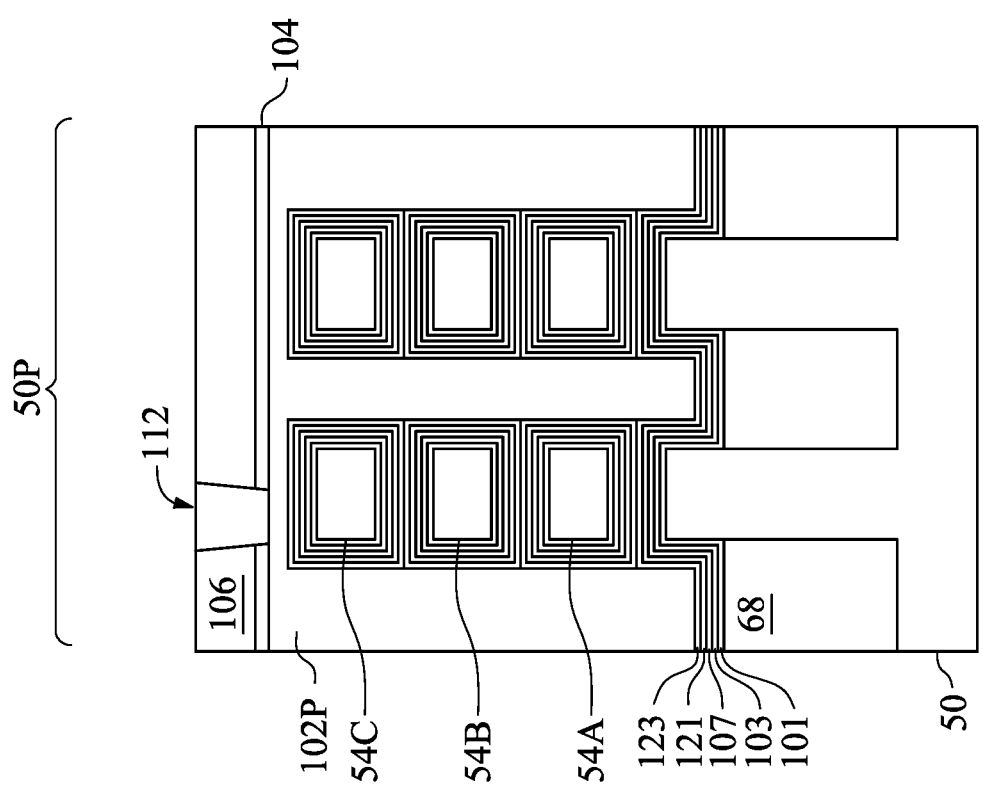
Figure 27B:
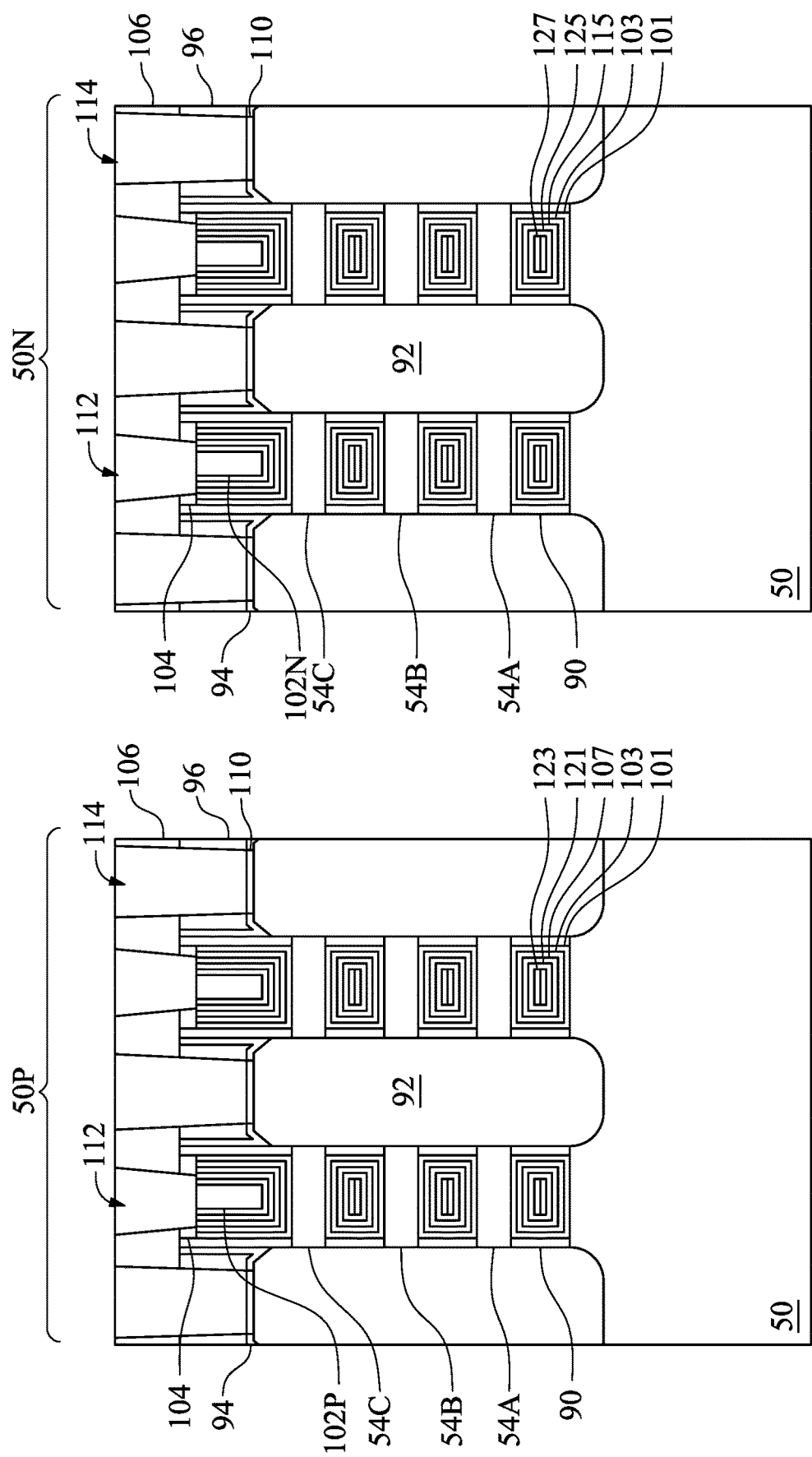
Figure 27C:
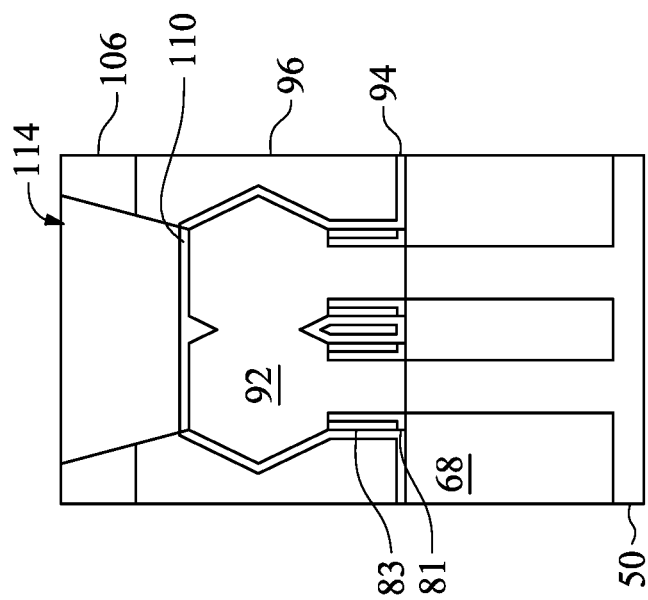

FIGS. 27A-27C illustrate cross-sectional views of a device according to some alternative embodiments. FIG. 27A illustrates reference cross-section A-A' illustrated in FIG. 1. FIG. 27B illustrates reference cross-section B-B' illustrated in FIG. 1. FIG. 27C illustrates reference cross-section C-C' illustrated in FIG. 1. In FIGS. 27A-27C, like reference numerals indicate like elements formed by like processes as the structure of FIGS. 24A-24C. However, in FIGS. 27A-27C, the work function metal layers 105 and 113 (e.g., metal nitride layers) may be omitted; additional work function metal layers 121, 123, 125, and 127 may be included in the gate structures, and channel regions in the n-type region 50N and the p-type region 50P comprise a same material. For example, the gate electrode 102P in the p-type region 50P may include an additional work function metal layer 121 over the work function metal layer 107 and a work function metal layer 123 over the work function metal layer 121. The work function metal layer 121 may be a metal nitride layer (e.g., comprising titanium nitride or the like) that comprises a similar material and is formed in a similar manner as the work function metal layer 105 described above (see FIGS. 18A and 18B). The work function metal layer 121 may be deposited in-situ (e.g., in a same chamber and without a break in vacuum environment) as the work function metal layer 107, or the work function metal layer 121 may be deposited ex-situ (e.g., in a different chamber and/or with an intervening break in vacuum environment) as the work function metal layer 107. The work function metal layer 123 may be a metal carbide layer (e.g., comprising Ti, Ta, Ce, Hf, V, Nb, Sc, Y, Mo, or the like) that comprises a similar material and is formed in a similar manner as the work function metal layer 107. The work function metal layer 123 may be deposited in-situ (e.g., in a same chamber and without a break in vacuum environment) as the work function metal layer 121, or the work function metal layer 123 may be deposited ex-situ (e.g., in a different chamber and/or with an intervening break in vacuum environment) as the work function metal layer 121. Further, the gate electrode 102N in the n-type region 50N may include an additional work function metal layer 125 over the work function metal layer 115 and a work function metal layer 127 over the work function metal layer 125. The work function metal layer 125 may be a metal nitride layer (e.g., comprising titanium nitride or the like) that comprises a similar material and is formed in a similar manner as the work function metal layer 113 described above (see FIGS. 21A and 21B). The work function metal layer 125 may be deposited in-situ (e.g., in a same chamber and without a break in vacuum environment) as the work function metal layer 115, or the work function metal layer 125 may be deposited ex-situ (e.g., in a different chamber and/or with an intervening break in vacuum environment) as the work function metal layer 115. The work function metal layer 127 may be a metal carbide layer (e.g., comprising Ti, Ta, Ce, Hf, V, Nb, Sc, Y, Mo, or the like) that comprises a similar material and is formed in a similar manner as the work function metal layer 115. The work function metal layer 127 may be deposited in-situ (e.g., in a same chamber and without a break in vacuum environment) as the work function metal layer 125, or the work function metal layer 127 may be deposited ex-situ (e.g., in a different chamber and/or with an intervening break in vacuum environment) as the work function metal layer 125.

Figure 28A:
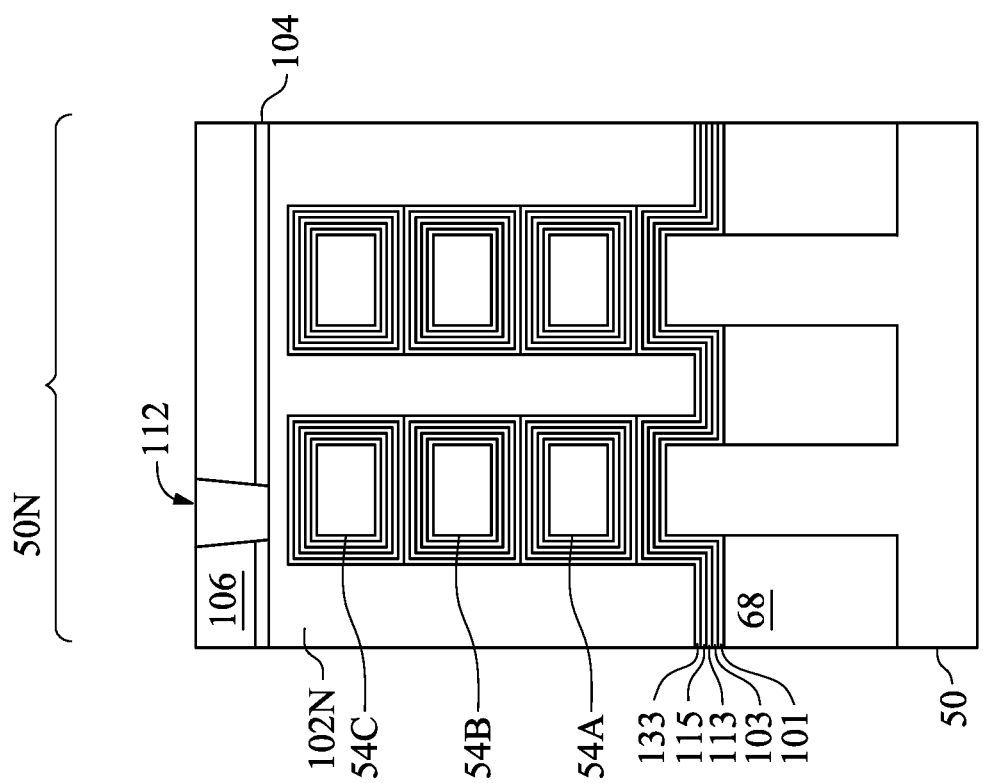
FIGS. 28A, 28B, and 28C are cross-sectional views of a nano-FET, in accordance with some embodiments.
Figure 28A:
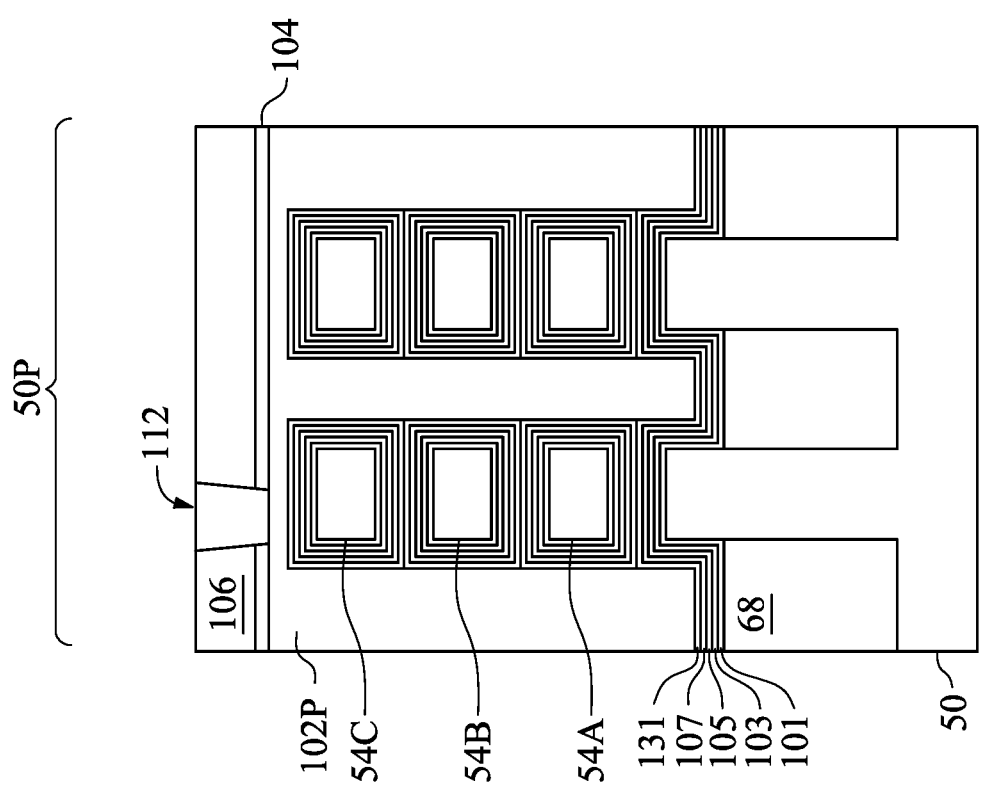
Figure 28B:
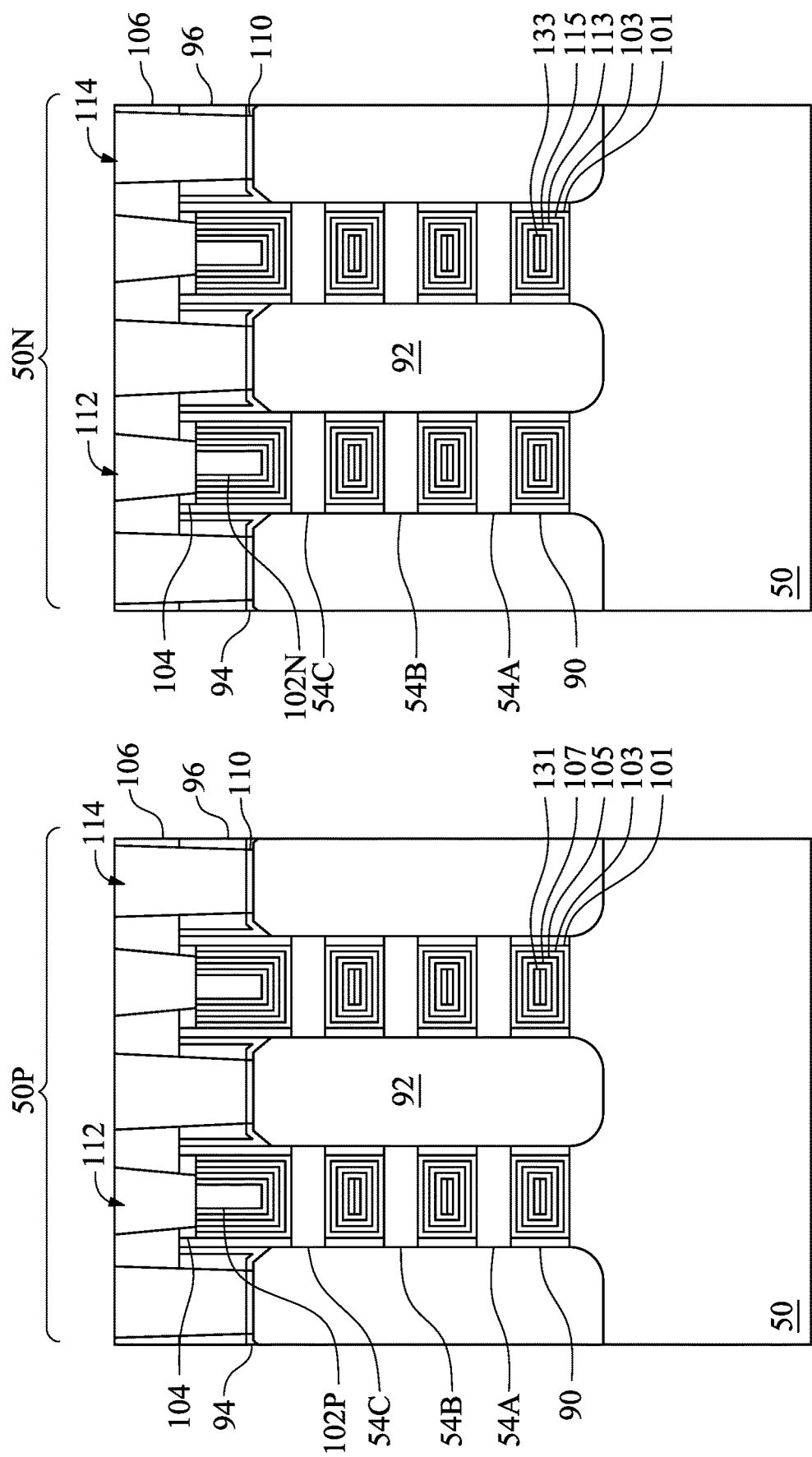
Figure 28C:
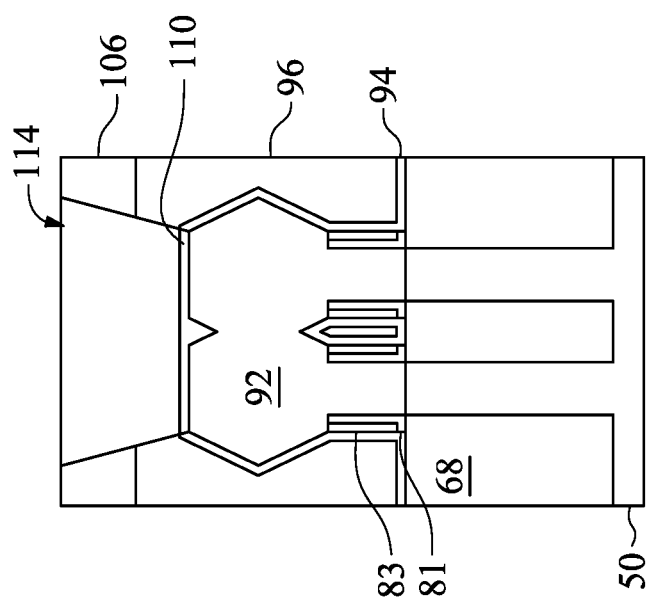

FIGS. 28A-28C illustrate cross-sectional views of a device according to some alternative embodiments. FIG. 28A illustrates reference cross-section A-A' illustrated in FIG. 1. FIG. 28B illustrates reference cross-section B-B' illustrated in FIG. 1. FIG. 28C illustrates reference cross-section C-C' illustrated in FIG. 1. In FIGS. 28A-28C, like reference numerals indicate like elements formed by like processes as the structure of FIGS. 24A-24C. However, in FIGS. 28A-28C, additional work function metal layers 131 and 133 may be included in the gate structures, and channel regions in the n-type region 50N and the p-type region 50P comprise a same material. For example, in the p-type region 50P, an additional work function metal layer 131 may be formed over the work function metal layer 107. The work function metal layer 131 may be a metal nitride layer (e.g., comprising titanium nitride or the like) that comprises a similar material and is formed in a similar manner as the work function metal layer 105. The work function metal layer 131 may be deposited in-situ (e.g., in a same chamber and without a break in vacuum environment) as the work function metal layer 107, or the work function metal layer 131 may be deposited ex-situ (e.g., in a different chamber and/or with an intervening break in vacuum environment) as the work function metal layer 107. In the n-type region 50N, an additional work function metal layer 133 may be formed over the work function metal layer 115. The work function metal layer 133 may be deposited in-situ (e.g., in a same chamber and without a break in vacuum environment) as the work function metal layer 115, or the work function metal layer 133 may be deposited ex-situ (e.g., in a different chamber and/or with an intervening break in vacuum environment) as the work function metal layer 115. The work function metal layer 133 may be a metal nitride layer (e.g., comprising titanium nitride or the like) that comprises a similar material and is formed in a similar manner as the work function metal layer 113.

Various embodiments herein include a gate structure having a work function metal layer that comprises a metal carbide. For example, the metal carbide may comprise Ce, Hf, V, Nb, Sc, YC, Hf, or Mo. The metal carbide layer may be used exclusively as the work function metal in the gate structure in some embodiments. In some embodiments, the metal carbide layer may be used in combination with one or more other work function metals (e.g., one or more TiN layers) to provide multiple work function metal layers in the gate structure. As a result of using different metal carbides as the work function metal, work function tuning may be more precisely achieved.

In some embodiments, a device includes a semiconductor substrate; a vertically stacked set of nanostructures over the semiconductor substrate; a first source/drain region; and a second source/drain region. The vertically stacked set of nanostructures extends between the first source/drain region and the second source/drain region along a first cross-section. The device further includes a gate structure encasing the vertically stacked set of nanostructures along a second cross-section, wherein the second cross-section is along a longitudinal axis of the gate structure. The gate structure comprises: a gate dielectric encasing each of the vertically stacked set of nanostructures; a first metal carbide layer over the gate dielectric, wherein the first metal carbide layer comprises Ce, Hf, V, Nb, Sc, Y, or Mo; and a gate fill material over the first metal carbide layer. Optionally, in an embodiment, the device further includes a first metal nitride layer between the first metal carbide layer and the gate dielectric. Optionally, in an embodiment, the first metal nitride layer comprises titanium nitride. Optionally, in an embodiment, the device further includes a second metal nitride layer over the first metal carbide layer. Optionally, in an embodiment, the device further includes a second metal carbide layer between the first metal carbide layer and the gate dielectric, wherein the second metal carbide layer comprises a different metal element than the first metal carbide layer. Optionally, in an embodiment, the second metal carbide layer comprises titanium carbide or tantalum carbide. Optionally, in an embodiment, the device further includes a third metal nitride layer over the first metal carbide layer; and a third metal carbide layer over the third metal nitride layer, wherein the gate fill material is disposed over the first metal carbide layer. Optionally, in an embodiment, the third metal carbide layer comprises Ti, Ta, Ce, Hf, V, Nb, Sc, Y, or Mo.

In some embodiments, a semiconductor device includes a plurality of channel regions; a first source/drain region comprising a first semiconductor material layer and a second semiconductor material over the first semiconductor material layer, wherein a surface of the first semiconductor material layer is curved; a second source/drain region, wherein the plurality of channel regions extend between the first source/drain region and the second source/drain region; a gate structure surrounding each of the plurality of channel regions. The gate structure comprises: a gate dielectric; a first metal nitride layer over the gate dielectric; a first metal carbide layer over the first metal nitride layer, wherein a metal element of the first metal carbide layer is Ce, Hf, V, Nb, Sc, Y, or Mo; and a gate fill material over the first metal carbide layer. Optionally, in an embodiment, the device further includes a second metal carbide layer between the first metal carbide layer and the first metal nitride layer, wherein the metal element of the first metal carbide layer is different than a metal element of the second metal carbide layer. Optionally, in an embodiment, the device further includes a second metal nitride layer over the first metal carbide layer. Optionally, in an embodiment, the first metal nitride layer has a thickness in a range of 5 Å to 15 Å. Optionally, in an embodiment, the gate dielectric, the first metal nitride layer, and the first metal carbide layer completely fill a first region, the first region spanning from a first channel region of the plurality of channel regions to a second channel region of the plurality of channel regions. Optionally, in an embodiment, the gate dielectric comprises: an interfacial layer; and a high-k dielectric over the interfacial layer.

In some embodiments, a method includes depositing a high-k gate dielectric layer over and along sidewalls of a semiconductor fin; depositing a first work function metal over the high-k gate dielectric layer, wherein depositing the first work function metal comprises flowing a first carbon-comprising precursor and a first metal-comprising precursor, wherein the first metal-comprising precursor comprises Ce, Hf, V, Nb, Sc, Y, or Mo; and depositing fill metal over the first work function metal. Optionally, in an embodiment, the method further includes depositing a second work function metal over the high-k gate dielectric layer prior to depositing the first work function metal, wherein depositing the second work function metal comprises flowing a second carbon-comprising precursor and a second metal-comprising precursor, wherein the second metal-comprising precursor comprises titanium or tantalum. Optionally, in an embodiment, the method further includes depositing a third work function metal over the high-k gate dielectric layer prior to depositing the first work function metal, wherein depositing the third work function metal comprises flowing a nitrogen-comprising precursor and a third metal-comprising precursor. Optionally, in an embodiment, the third metal-comprising precursor comprises titanium. Optionally, in an embodiment, the first metal-comprising precursor comprises $TaCl_5$, $CeCl_4$, $HfCl_4$, $VCl_3$, $NbCl_5$, $ScCl_4$, $YCl_x$, or $MoCl_x$. Optionally, in an embodiment, the method further includes depositing a fourth work function metal over the first work function metal, wherein depositing the fourth work function metal comprises flowing nitrogen-comprising precursor and a fourth metal-comprising precursor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor substrate;
   a vertically stacked set of nanostructures over the semiconductor substrate;
   a first source/drain region;
   a second source/drain region, wherein the vertically stacked set of nanostructures extends between the first source/drain region and the second source/drain region along a first cross-section;
   a gate structure encasing the vertically stacked set of nanostructures along a second cross-section, wherein the second cross-section is along a longitudinal axis of the gate structure, and wherein the gate structure comprises:
   a gate dielectric encasing each of the vertically stacked set of nanostructures;
   a first metal carbide layer over the gate dielectric, wherein the first metal carbide layer comprises Ce, Hf, V, Nb, Sc, Y, or Mo;
   a second metal carbide layer between the first metal carbide layer and the gate dielectric, wherein the second metal carbide layer comprises a different metal element than the first metal carbide layer; and
   a gate fill material over the first metal carbide layer.

2. The device of claim 1 further comprising a first metal nitride layer between the first metal carbide layer and the gate dielectric.

3. The device of claim 2, wherein the first metal nitride layer comprises titanium nitride.

4. The device of claim 2 further comprising a second metal nitride layer over the first metal carbide layer.

5. The device of claim 1, wherein the second metal carbide layer comprises titanium carbide or tantalum carbide.

6. The device of claim 1 further comprising:
   a third metal nitride layer over the first metal carbide layer; and
   a third metal carbide layer over the third metal nitride layer, wherein the gate fill material is disposed over the first metal carbide layer.

7. The device of claim 6, wherein the third metal carbide layer comprises Ti, Ta, Ce, Hf, V, Nb, Sc, Y, or Mo.

8. A semiconductor device comprising:
   a plurality of channel regions;
   a first source/drain region comprising a first semiconductor material layer and a second semiconductor material over the first semiconductor material layer, wherein a surface of the first semiconductor material layer is curved;
   a second source/drain region, wherein the plurality of channel regions extends between the first source/drain region and the second source/drain region;
   a gate structure surrounding each of the plurality of channel regions, wherein the gate structure comprises:
   a gate dielectric;
   a first metal nitride layer over the gate dielectric;
   a first metal carbide layer over the first metal nitride layer, wherein a metal element of the first metal carbide layer is Ce, Hf, V, Nb, Sc, Y, or Mo;
   a second metal carbide layer between the first metal carbide layer and the first metal nitride layer, wherein the metal element of the first metal carbide layer is different than a metal element of the second metal carbide layer; and
   a gate fill material over the first metal carbide layer.

9. The semiconductor device of claim 8 further comprising a second metal nitride layer over the first metal carbide layer.

10. The semiconductor device of claim 8, wherein the first metal nitride layer has a thickness in a range of 5 Å to 15 Å.

11. The semiconductor device of claim 8, wherein the gate dielectric, the first metal nitride layer, and the first metal carbide layer completely fill a first region, the first region spanning from a first channel region of the plurality of channel regions to a second channel region of the plurality of channel regions.

12. The semiconductor device of claim 8, wherein the gate dielectric comprises:
an interfacial layer; and
a high-k dielectric over the interfacial layer.

13. A method of manufacturing a semiconductor device, the method comprising:
depositing a high-k gate dielectric layer over and along sidewalls of a semiconductor fin;
depositing a first work function metal over the high-k gate dielectric layer, wherein depositing the first work function metal comprises flowing a first carbon-comprising precursor and a first metal-comprising precursor, wherein the first metal-comprising precursor comprises Ce, Hf, V, Nb, Sc, Y, or Mo;
depositing a second work function metal over the high-k gate dielectric layer prior to depositing the first work function metal, wherein depositing the second work function metal comprises flowing a second carbon-comprising precursor and a second metal-comprising precursor, the second metal-comprising precursor comprising a different metal element than the first metal-comprising precursor; and
depositing fill metal over the first work function metal.

14. The method according to claim 13, wherein the second metal-comprising precursor comprises titanium or tantalum.

15. The method according to claim 13 further comprising depositing a third work function metal over the high-k gate dielectric layer prior to depositing the first work function metal, wherein depositing the third work function metal comprises flowing a nitrogen-comprising precursor and a third metal-comprising precursor.

16. The method according to claim 15, wherein the third metal-comprising precursor comprises titanium.

17. The method according to claim 13, wherein the first metal-comprising precursor comprises $TaCl_5$, $CeC_{l4}$, $HfC_{l4}$, $VC_{l3}$, $NbC_{l5}$, $ScC_{l4}$, $YCl_x$, or $MoCl_x$.

18. The method according to claim 13 further comprising depositing a fourth work function metal over the first work function metal, wherein depositing the fourth work function metal comprises flowing a nitrogen-comprising precursor and a fourth metal-comprising precursor.

19. The semiconductor device of claim 8, wherein the first metal nitride layer has a thickness in a range of 5 Å to 15 Å.

20. The semiconductor device of claim 8, wherein the first metal nitride layer comprises the metal element of the second metal carbide layer.

* * * * *